United States Patent
Tonomura et al.

(10) Patent No.: US 11,303,305 B2
(45) Date of Patent: Apr. 12, 2022

(54) SPARSE GRAPH CREATION DEVICE AND SPARSE GRAPH CREATION METHOD

(71) Applicant: NIPPON TELEGRAPH AND TELEPHONE CORPORATION, Tokyo (JP)

(72) Inventors: Yoshihide Tonomura, Yokosuka (JP); Daisuke Shirai, Yokosuka (JP); Tatsuya Fujii, Yokosuka (JP); Takayuki Nakachi, Yokosuka (JP); Takahiro Yamaguchi, Yokosuka (JP); Masahiko Kitamura, Yokosuka (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 1029 days.

(21) Appl. No.: 15/027,456

(22) PCT Filed: Oct. 8, 2014

(86) PCT No.: PCT/JP2014/076910
§ 371 (c)(1),
(2) Date: Apr. 6, 2016

(87) PCT Pub. No.: WO2015/060130
PCT Pub. Date: Apr. 30, 2015

(65) Prior Publication Data
US 2016/0248448 A1    Aug. 25, 2016

(30) Foreign Application Priority Data
Oct. 22, 2013 (JP) .............................. JP2013-218933

(51) Int. Cl.
*G06F 16/00* (2019.01)
*H03M 13/00* (2006.01)
(Continued)

(52) U.S. Cl.
CPC ...... *H03M 13/615* (2013.01); *G06F 16/9024* (2019.01); *H03M 13/036* (2013.01);
(Continued)

(58) Field of Classification Search
CPC . H03M 13/615; H03M 13/1191; G06F 16/20; G06F 16/9024
See application file for complete search history.

(56) References Cited

U.S. PATENT DOCUMENTS 5,327,561 A * 7/1994 Choi ....................... G06F 8/433
                                                717/144
2007/0294607 A1    12/2007 Uchida et al.
(Continued)

FOREIGN PATENT DOCUMENTS

| EP | 2503698 | 9/2012 |
|----|---------|--------|
| JP | 2011109228 A | 6/2011 |
| WO | 2006027897 A1 | 3/2006 |

OTHER PUBLICATIONS

Gallager, Robert G.; "Low-Density Parity-Check Codes"; Cambridge, MA; Jul. 1963; 90 pages.
(Continued)

*Primary Examiner* — Usmaan Saeed
*Assistant Examiner* — David M Nafziger
(74) *Attorney, Agent, or Firm* — Ohlandt, Greeley, Ruggiero and Perle, LLP

(57) ABSTRACT

A selective PEG algorithm, creating a sparse matrix while maintaining row weight/column weight at arbitrary multilevels, and in the process, inactivating an arbitrary edge so that a minimum loop formed between arbitrary nodes is enlarged or performing constrained interleaving, so that encoding efficiency in the case where a matrix space is narrow is improved.

4 Claims, 19 Drawing Sheets

(51) Int. Cl.
G06F 16/901 (2019.01)
H03M 13/03 (2006.01)
H03M 13/11 (2006.01)
H03M 13/37 (2006.01)

(52) U.S. Cl.
CPC ...... *H03M 13/1102* (2013.01); *H03M 13/118* (2013.01); *H03M 13/1191* (2013.01); *H03M 13/373* (2013.01); *H03M 13/3761* (2013.01); *H03M 13/6393* (2013.01)

(56) References Cited

U.S. PATENT DOCUMENTS

| | | | |
|---|---|---|---|
| 2008/0294969 A1* | 11/2008 | Divsalar | H03M 13/6393 714/801 |
| 2009/0030921 A1* | 1/2009 | Kadiyska | G06F 40/143 |
| 2009/0292966 A1* | 11/2009 | Liva | H04L 1/005 714/752 |
| 2010/0146007 A1* | 6/2010 | Kononov | G06Q 30/02 707/802 |
| 2010/0211847 A1* | 8/2010 | Livshitz | H04L 1/0057 714/752 |
| 2012/0060126 A1* | 3/2012 | Jackson, Jr. | G06F 16/2246 715/854 |
| 2012/0095957 A1* | 4/2012 | Reddy | G06F 16/24535 707/602 |
| 2013/0227054 A1* | 8/2013 | Zhang | G06Q 30/0269 709/217 |
| 2014/0046959 A1* | 2/2014 | Moreels | G06F 16/24578 707/748 |
| 2014/0086232 A1* | 3/2014 | Ling | H04L 25/024 370/346 |
| 2014/0208297 A1* | 7/2014 | Chockler | G06F 11/3608 717/126 |
| 2014/0337358 A1* | 11/2014 | Mitra | G06F 16/248 707/748 |
| 2015/0092290 A1* | 4/2015 | Liu | H03M 13/1117 360/47 |
| 2015/0113031 A1* | 4/2015 | Reinwald | G06F 12/0223 708/520 |
| 2015/0293994 A1* | 10/2015 | Kelly | H04L 41/12 707/740 |
| 2015/0310346 A1* | 10/2015 | Shiraki | G06N 7/005 706/12 |
| 2015/0332344 A1* | 11/2015 | Vaynblat | H04L 51/36 705/14.53 |
| 2016/0072523 A1* | 3/2016 | Muhammad | H04L 1/0071 714/776 |
| 2016/0134441 A1* | 5/2016 | Paker | H04L 25/03242 375/233 |
| 2016/0224565 A1* | 8/2016 | Hardas | G06F 16/2246 |

OTHER PUBLICATIONS

Luby, Michael; "LT Codes"; Proceedings of the 43rd Annual IEEE Symposium on Foundations of Computer Science (FOCS '02); 1 page.
Shokrollahi, Amin; "Raptor Codes"; IEEE Transactions on Information Theory; vol. 52, No. 6; Jun. 2006; 17 pages.
Luby et al.; "Asynchronous Layered Coding (ALC) Protocol Instantiation"; The Internet Society; Dec. 2002; 36 pages.
Hu et al.; "Progressive Edge-Growth Tanner Graphs"; Global Telecommunications Conference; Globecom 2001, IEEE, Nov. 29, 2011, vol. 2, pp. 995-1001.
Planjery et al.; "Design of Rate-Compatible Punctured Repeat-Accumulate Codes"; IEEE Globecom; 2007; 6 pages.
Sugihara et al.; "Coding Rate Adjustment for LDPC Codes by Row-Splitting"; Institute of Electronics, Information, and Communication Engineers; Mar. 2, 2010; 3 pages.
Sugihara et al.; "Constructing Algorithms of Large-Girth LDPC Codes Based on the Shortest Paths in Tanner Graphs"; Institute of Electronics, Information, and Communication Engineers; vol. 110, No. 443; Feb. 24, 2011; pp. 69-74.
International Search Report dated Jan. 20, 2015 from corresponding International Application No. PCT/JP2014/076910, 8 pages.
Written Opinion dated Jan. 20, 2015 from corresponding International Application No. PCT/JP2014/076910, 4 pages.
International Preliminary Report on Patentability dated May 6, 2016 from corresponding International Patent Application No. PCT/JP2014/076910, 8 pages.
Supplemental Partial European Search Report dated May 16, 2017 for corresponding PCT/JP2014/076910, 20 pages.
Arnold et al, "Regular and Irregular Progressive Edge-Growth Tanner Graphs", IEEE Transactions on Information Theory, IEEE Press, USA, vol. 51, No. 1, Jan. 1, 2005, pp. 386-398.
Yazdani, et al, "On Construction of Rate-Compatible Low-Density Parity-Check Codes", Proc., IEEE International Conference on Communications, ICC 2004, vol. 1, Jun. 20, 2004, pp. 430-434.
Richter, et al., "On a Construction Method of Irregular LDPC Codes Without Small Stopping Sets", Proc., IEEE International Conference on Communications, ICC '06, Jun. 1, 2006, pp. 1119-1124.
Xueqin Jiang , et al., "Low-Density MIMO Codes based on Multiple Parity-Check Codes", Proc., IEEE International Conference on Wireless Communications and Signal Processing, WCSP 2010, Oct. 21, 2010, pp. 1-5.
Xueqin Jiang , et al., "Modified Progressive Edge-Growth Algorithm for Fast-Encoding LDPC Codes", Proc., IEEE Vehicular Technology Conference, VTC 2010—Fall, Sep. 6, 2010-Sep. 9, 2010, pp. 1-5.
Jong-Ee Oh, et al., "Row-Splitting design of Low-Density Parity-Check Codes for Gbps transmission", Proc., IEEE Vehicular Technology Conference, VTC 2007 Fall, Sep. 1, 2007, pp. 1127-1131.
Min Jang, et al., "Design of Irregular LDPC Codes with Degree-Set and Degree-Sum Distributions", Proc., IEEE 23rd International Symposium on Personal, Indoor and Mobile Radio Communications, PIMRC 2012, Sydney, Australia, Sep. 9, 2012-Sep. 12, 2012, pp. 1925-1930.
Jiang et al: "An Improved Construction of LDPC Codes Based on Data Punctured Hybrid ARQ", IEEE International Conference on Communications, Circuits and Systems, Guilin, Guangxi, China, Jun. 25, 2006 (Jun. 25, 2006), Jun. 28, 2006 (Jun. 28, 2006), pp. 702-706.
Li et al: "Design of LDPC codes for non-contiguous OFDM-based communication Systems", IEEE International Conference on Communications, ICC 2012, Jun. 10, 2012 (Jun. 10, 2012), pp. 4712-4716.
Pin-Biao et al: "Research on the Performance of OFDM Communication System Based on LDPC-BICM-ID Scheme", IEEE Third International Symposium on Information Processing, ISIP 2010,Oct. 15, 2010 (Oct. 15, 2010), pp. 198-202.
Extended European Search Report dated Nov. 13, 2017 from corresponding European Patent Application 17181109.4, 11 pages.
Summons to Attend Oral Proceedings dated Jul. 11, 2018 in corresponding European Patent Application No. 14855171.6, 14 pages.

* cited by examiner

SPARSE GRAPH CREATION DEVICE AND SPARSE GRAPH CREATION METHOD

BACKGROUND

1. Field of the Disclosure

The present disclosure relates to a sparse graph creation device and method for a sparse graph code, and more particularly, a device and method efficiently enabling a sparse graph code by enlarging a minimum loop formed between arbitrary nodes.

2. Discussion of the Background Art

At present, error correction techniques are widely used for various communication systems such as satellite digital broadcasting, communication on the Internet, and communication by mobile terminals. In particular, recently, with the development of broadband environments, video transmission services using the Internet or the like have been expected, and thus, the error correction techniques on the Internet have become important. Hereinafter, description will be made by exemplifying the Internet.

As a channel is viewed from a side performing a service by using the Internet, the Internet may be recognized as a packet erasure channel (PEC). This is obtained by grouping binary packet erasure channels (FIG. 1) in units of a packet, and the channel corresponds to any one of the case where the channel output is output as correct information and the case where the channel output is output as unclear information that was caused by some kind of obstacles in the communication channel. In this communication system, used is an erased packet recovering method called forward error correction (FEC) or automatic repeat request (ARQ). In a general IP-based service, a TCP/IP protocol is used, and at a decoder side, only error detection is performed; and thus, in the case where error occurs, a method of recovering the error by re-transmission control or the like is used (ARQ method). However, in the case where a large-scale serve such as multicast transmission is considered, error correction is required to be performed based on data received from a receiver side, and thus, a method capable of correcting error only at the receiver side without requiring a feedback channel is used (FEC method). In the FEC method, since re-transmission control is not performed, delay becomes small, and thus, the FEC method is used for a TV conference system of which real-time capability is important. Hereinafter, the FEC method will be described.

As an FEC method, a Reed-Solomon code (RS code) is widely used for digital broadcasting or the like. In Japanese digital broadcasting, a code length is defined to be 204 bytes, and substantially 10[%] parity byte is added to original data of 188 bytes, so that resistance to the error is provided. However, in general, it is known that, if a code having a long code length is used as an error correction code, performance is improved; and however, it is known that, as the code length is increased, decoding becomes complicated, and thus, there occurs a problem in that a calculation amount becomes large. Therefore, with respect to the RS code, it is presumed that the code length is treated to be 256 bytes or less. In addition, in the case where the RS code is adapted to a packet called an IP-based packet level FEC, due to the above-described reason, 256 packets needs to be treated as one block.

In contrast, it is known that, in case of a long code length, a decoding method based on a belief propagation algorithm has excellent decoding characteristics with a practical calculation, and a low-density parity check code (LDPC code, refer to, for example, Non Patent Literature 1) that is, a linear code defined by a sparse graph has drawn attention as a practical error correction method which approaches a channel capacity defined by Shannon. In addition, as an erasure correction code based on a sparse graph, there are known an LT code (refer to, for example, Non Patent Literature 2) of Digital Fountain Inc. and a Raptor code (refer to, for example, Non Patent Literature 3), and it is known that, only by receiving arbitrary code data without much deterioration in encoding efficiency, decodable encode characteristics can be achieved with a fulfilling calculation amount. This property is widely used for multicast communication or the like having a layered configuration in order to comply with asynchronous layered coding (ALC) (refer to, for example, Non Patent Literature 4) as an Internet multicast protocol.

CITATION LIST

Non Patent Literature

Non Patent Literature 1: R. G. Gallager, "Low density parity check codes", in Research Monograph series. Cambridge, MIT Press, 1963

Non Patent Literature 2: M. Luby, "LT Codes", The 43rd Annual IEEE Symposium on Foundations of Computer Science, 2002

Non Patent Literature 3: Shokrollahi, A, "Raptor codes", Information Theory, IEEE Transactions on Volume 52, Issue 6, 2006

Non Patent Literature 4: "Asynchronous layered coding protocol instantiation", IETF RFC 3450, December 2002

Non Patent Literature 5: Xiao-Yu Hu, Evangelos Eleftheriou, Dieter-Michael Arnold, "Progressive Edge-Growth Tanner Graphs", IEEE Global Telecommunications Conference, 2001. GLOBECOM '01

Non Patent Literature 6: Shiva K. Planjery and T. Aaron Gulliver, "Design of Rate-Compatible Punctured Repeat-Accumulate Codes", IEEE Global Telecommunications Conference, 2007. GLOBECOM '07

SUMMARY

As described above, the error correction code using the sparse graph and the belief propagation algorithm can achieve the encode characteristic which cannot be achieved in the related work. However, in general, it is known that it is difficult to construct a sparse graph code so that the sparse graph code works well. This is because, in the case where there is no loop in the sparse graph, although it is known which type of belief propagation algorithm is optimal, in actual cases, the loop occurs, and thus, it is known that it is difficult to configure a sparse graph where the loop becomes as large as possible in terms of a calculation amount.

In order to solve this problem, proposed is a method of creating a sparse graph having a good practical calculation amount although the sparse graph has a loop structure which is not optimal as the overall sparse graph is viewed (refer to, for example, Non Patent Literature 5). A method called a progressive edge-growth (PEG) algorithm is a method where, in a process of creating nodes without global optimization so that a girth of nodes is lengthened over the entire sparse graph, a local graph over a node of interest is created, the loop is lengthened within the range thereof, so that a good sparse graph is created with some small calculation amount. Branches (lines) in the graph are referred to as edges, and the PEG algorithm creates the edges. In addition, with respect to the correspondence between the sparse matrix and the graph, a column of the matrix corresponds to an information node, a row thereof corresponds to a check node, and one stand location of the sparse matrix corresponds to an edge connecting the information node and the check node.

However, in the PEG algorithm, in the case where a local range is filled with short loops and, thus, when edges of a large loop cannot be created, the following matrix becomes a matrix which is created at random, so that it cannot be ensured at all that the loop is to be lengthened. In this state, the nodes are created at random to be substantially equal to each other, and short loop is easy to create. Due to this phenomenon, for example, there is the case of using a sparse graph created by using a rate-adaptive LDPC code (refer to, for example, Non Patent Literature 6) or the like, which leads to significant deterioration in encoding efficiency in order to use a portion of the sparse graph or the like.

In addition, in the case of creating an irregular sparse matrix (hereinafter, referred to as an irregular matrix) having some column weight, in the PEG algorithm, after a heavy column or row enters, it is difficult to find the node by which the loop is enlarged, and thus, the sparse graph which is created at random easily occurs. This is because the number of edges is increased, and thus, the loop is easy to create.

The present disclosure is to efficiently create a sparse graph in a sparse graph code.

The present disclosure relates to a sparse matrix creation method for an LDPC code, and in particular, the present disclosure is to reform a progressive edge-growth (PEG) algorithm to improve encoding efficiency according to a transmission rate by selecting a node set of lengthening a loop in response to a request of a sparse matrix in order to perform local optimization of lengthening a short loop occurring between arbitrary node sets in the sparse matrix.

Specifically, a sparse graph creation device according to the present disclosure is a sparse graph creation device creating a sparse graph used for a sparse graph code, and includes: an inactivation unit which inactivates at least a portion of nodes in the sparse graph; a searching unit which searches for a node which can be reached through a minimum number of edges from the activated node connected to an arbitrary route node which becomes a route in creation of a local graph from the remaining sparse graph inactivated by the inactivation unit; a node selection unit which selects a node satisfying a predetermined condition at a position where the edge is created from a result of the searching of the searching unit; and a route-node edge connection unit which connects the node selected by the node selection unit and the route node.

In the sparse graph creation device according to the present disclosure, the node selection unit may select a node which enlarges a loop with a small calculation amount by performing the searching by limiting a next search range from information on the searching obtained from the node creating process up to this time.

Specifically, a sparse graph creation device according to the present disclosure is a sparse graph creation device creating a sparse graph used for a sparse graph code, and includes: a searching unit which searches for a node which can be reached through a minimum number of edges from an activated node connected to an arbitrary route node which becomes a route in creation of a local graph from the sparse graph; a node selection unit which selects a node satisfying a predetermined condition at a position where the edge is created from a result of the searching of the searching unit; a route-node edge connection unit which connects the node selected by the node selection unit and the route node; and a constrained interleaving unit which rearranges the nodes in the sparse graph where an edge is created at a position selected by the route-node edge connection unit so that each weights of sparse matrices are uniformly distributed in terms of a space.

In the sparse graph creation device according to the present disclosure, the constrained interleaving unit may rearrange the nodes in the sparse graph so that a graph structure of activated nodes is maintained.

The sparse graph creation device according to the present disclosure may further include a node expansion unit which installs a new node so that a total number of edges of the sparse graph is not changed and a minimum loop is not shortened.

Specifically, a sparse graph creation method according to the present disclosure is a sparse graph creation method creating a sparse graph used for a sparse graph code, and includes: sequentially an inactivating process of inactivating at least a portion of nodes in the sparse graph; a searching process of searching for a node which can be reached through a minimum number of edges from the activated node connected to an arbitrary route node which becomes a route in creation of a local graph from the remaining sparse graph inactivated by the inactivating process; a node selecting process of selecting a node satisfying a predetermined condition at a position where the edge is created from a result of the searching of the searching process; and a route-node edge connecting process of connecting the node selected by the node selecting process and the route node.

In the sparse graph creation method according to the present disclosure, in the node selecting process, a node which enlarges a loop with a small calculation amount may be selected by performing the searching by limiting a next search range from information on the searching obtained from the node creating process up to this time.

Specifically, a sparse graph creation method according to the present disclosure is a sparse graph creation method creating a sparse graph used for a sparse graph code, and includes: sequentially a searching process of searching for a node which can be reached through a minimum number of edges from an activated node connected to an arbitrary route node which becomes a route in creation of a local graph from the sparse graph; a node selecting process of selecting a node satisfying a predetermined condition at a position where the edge is created from a result of the searching of the searching process; a route-node edge connecting process of connecting the node selected by the node selecting process and the route node; and a constrained interleaving process of rearranging the nodes in the sparse graph where an edge is created at a position selected by the route-node connecting process so that each weights of sparse matrices are uniformly distributed in terms of a space.

In the sparse graph creation method according to the present disclosure, in the constrained interleaving process, the nodes in the sparse graph may be rearranged so that a graph structure of activated nodes is maintained.

The sparse graph creation method according to the present disclosure may further include a node expansion process of installing a new node so that a total number of edges of the sparse graph is not changed and a minimum loop is not shortened after the node selecting process and before the constrained interleaving process.

In addition, the disclosures may be combined if possible.

According to the present disclosure, a sparse graph in a sparse graph code can be efficiently created.

DETAILED DESCRIPTION OF THE PREFERRED EMBODIMENT

Figure 1:
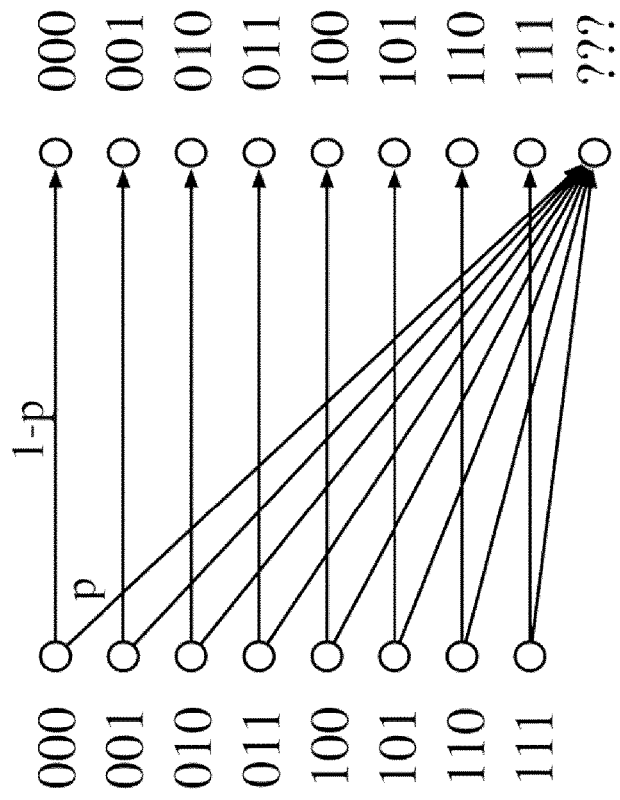
FIG. 1 illustrates an example of a packet erasure channel.

Hereinafter, embodiments of the present disclosure will be described in detail with reference to the drawings. In addition, the present disclosure is not limited to embodiments described hereinafter. These embodiments are simply examples, and thus, the present disclosure can be embodied as various changes and modifications of the embodiments performed based on the knowledge of the skilled person in the art. In addition, in the specification and the drawings, the same components are denoted by the same reference numerals.

Although the present disclosure can be embodied without depending on the type of a channel, description will be made by exemplifying packet transmission using a UDP protocol used for multicast transmission. If the UDP protocol is used, even in the case where a UDP packet is erased, re-transmission is not performed unlike a TCP protocol, and as illustrated in FIG. 1, characteristics of a packet erasure channel can be obtained where it can be determined whether or not a received packet is correct and a position of the erased packet can be accurately determined.

Figure 2:
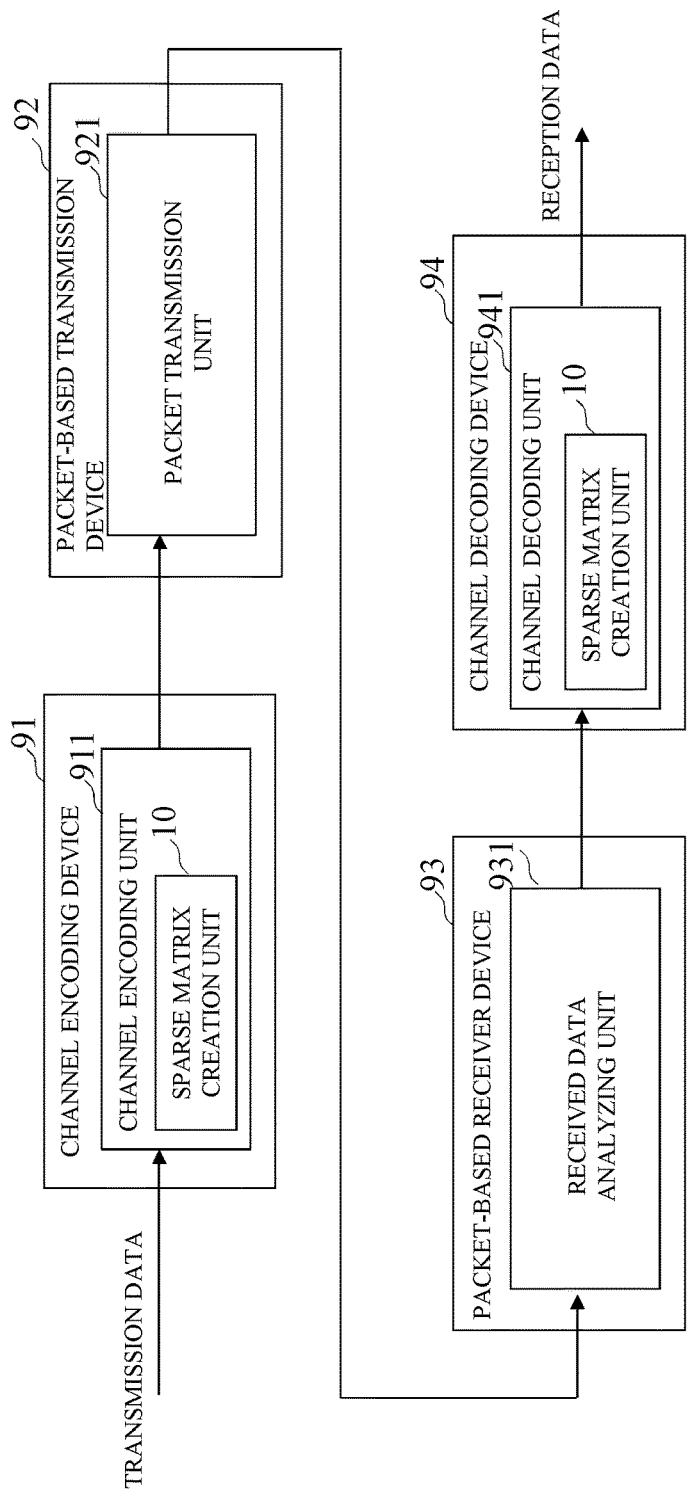
FIG. 2 illustrates an example of a communication system according to an embodiment.

FIG. 2 illustrates an example of a communication system according to an embodiment. The communication system according to the embodiment is configured to include a channel encoding device 91, a packet transmission device 92, a packet-based receiver device 93, and a channel decoding device 94. The channel encoding device 91 encodes transmission data by using a sparse matrix. The packet transmission device 92 transmits the encoded transmission data. The packet-based receiver device 93 receives the transmission data. The channel decoding device 94 decodes received data by using the sparse matrix. The encoding of the channel encoding device 91 and the decoding of the channel decoding device 94 are performed by using the sparse matrix created by a sparse matrix creation unit 10 which functions as a sparse matrix creation device according to the embodiment.

As an example of the communication system according to the embodiment, an error correction function for a packet level FEC which can be implemented according to the present disclosure will be described. The transmission data such as video data and audio data are encoded by the channel encoding device 91. At this time, in general, the channel encoding device 91 performs fragmentation or the like by taking into consideration a packet size or the like of the packet transmission device 92 which is to be connected later. In the case where a linear code such as an LDPC code is used for the encoding, the channel encoding device 91 creates redundant data by the following encoding process.

[Mathematical Formula 1]

$$C_m^t = [T_{m,m}^{-1}][G_{m,k}]S_k^t \tag{1}$$

Herein, S is a fragment formed by fragmenting the input data such as a video data by a certain size, and G and T are sparse matrices corresponding to sparse graphs. In addition, in the case where the LDPC code is of a type called LDPC-Staircase, the matrix T is a staircase matrix. The matrix $T^{-1}$ can be replaced with an accumulator, and by using the accumulator, the encode process can be performed at a high speed.

In the figure, the sparse matrix creation unit 10 creates the matrices G and T improving encoding efficiency and decoding efficiency by using a small calculation amount. Since an information amount of the created sparse matrix is large, in general, a parameter of the sparse matrix is extracted to be notified to the channel decoding device 94 of the decoding side. The parameter is, for example, the generated parity data and FEC supplementary information. The packet-based transmission device 92 transmits the extracted parameter together with the video data or the audio data in accordance with an FLUTE standard (RFC 3926), an MPEG media trans-port (ISO/IEC 23008-1) standard, or the like. The packet-based receiver device 93 of the receiver side receives the packet transmitted from the packet-based transmission device 92. At this time, the packet-based receiver device 93 compares the packet with a header format of FLUTE, and in the case where packet erasure occurs, recovery of the erased packet is tried in the channel decoding device 94. The channel decoding device 94 corresponds to the encoding, and it is shared in advance from the supplementary information or the like that the following constraints are satisfied.

[Mathematical Formula 2]

$$0 = [G_{m,k} | T_{m,m}] \begin{bmatrix} S_k^t \\ - \\ C_m^t \end{bmatrix} \quad (2)$$

[Mathematical Formula 3]

$$= [H_{m,n}]x_n^t \quad (3)$$

Herein, the matrices G and T are sparse matrices corresponding to the sparse graphs, and the same information as that of the encoding side is used.

In general, since a data amount of the sparse matrix information is large, the sparse matrices are shared according to notification of the parameter from the encoding side to the decoding side. In the decoding side, the sparse matrix creation unit 10 creates the same sparse matrices as those of the encoding side from the notified parameter. The decoding side decodes the erased packet by using the above-described equations. When an index set of erased packets is denoted by ε, a parity check matrix corresponding to erased packets is denoted by $H_\varepsilon$, and a set of erased packets is denoted by $x_\varepsilon$, the above-described equation can be expressed by the following equation.

[Mathematical Formula 4]

$$[H_\varepsilon]x_\varepsilon^t = [H_{\varepsilon'}]x_{\varepsilon'}^t \quad (4)$$

Herein, in the right-handed side, ε' denotes an index set of received packets.

If the number of ranks of $H_\varepsilon$ is the number of erased packets $|x_\varepsilon|$, the erased packets can be recovered by maximum likelihood decoding from the above-described equation. As the decoding method, various methods are proposed, and there are a method of performing recovery by a message passing algorithm, a method of performing recovery by a Gaussian elimination method and the like. In general, in the message passing algorithm, since decoding utilizing sparseness of a sparse graph is available, the decoding in O(N) is available, and however, in the Gaussian elimination method, an operation $O(N^3)$ is necessary for a pre-process of obtaining an inverse matrix, and an operation $O(N^2)$ is necessary for a calculation process of actually recovering the packets.

According to the present disclosure, in the channel encoding device and the channel decoding device, a sparse matrix having high error correction capability and high encoding efficiency can be created at a high speed, and the matrix can be efficiently corrected in the message passing algorithm as well as in the Gaussian elimination method. In addition, due to combination with a rate-adaptive LDPC code, the matrix does not need to be created from 0 again for each time, and thus, even in the case where one sparse matrix is applied with various rates, error correction with high encoding efficiency can be performed.

First Embodiment

In this embodiment, a selective PEG algorithm improves encoding efficiency in the case where a matrix space is narrow by creating a sparse matrix while maintaining row weight/column weight at arbitrary multi-levels and by inactivating arbitrary edges during the process.

A sparse graph creation method according to the embodiment is configured to sequentially include an inactivating process, a searching process, a node selecting process, and a route node edge connecting process.

In the inactivating process, at least a portion of nodes in a sparse graph is inactivated.

In the searching process, the node which can be reached through the minimum number of edges from activated nodes connected to an arbitrary route node which becomes a route in creation of a local graph is searched for from the remaining sparse graph inactivated.

In the node selecting process, the nodes satisfying predetermined conditions are selected from a result of the searching.

In the route node edge connecting process, the nodes selected in the node selecting process and the route node are connected to each other.

Figure 3:
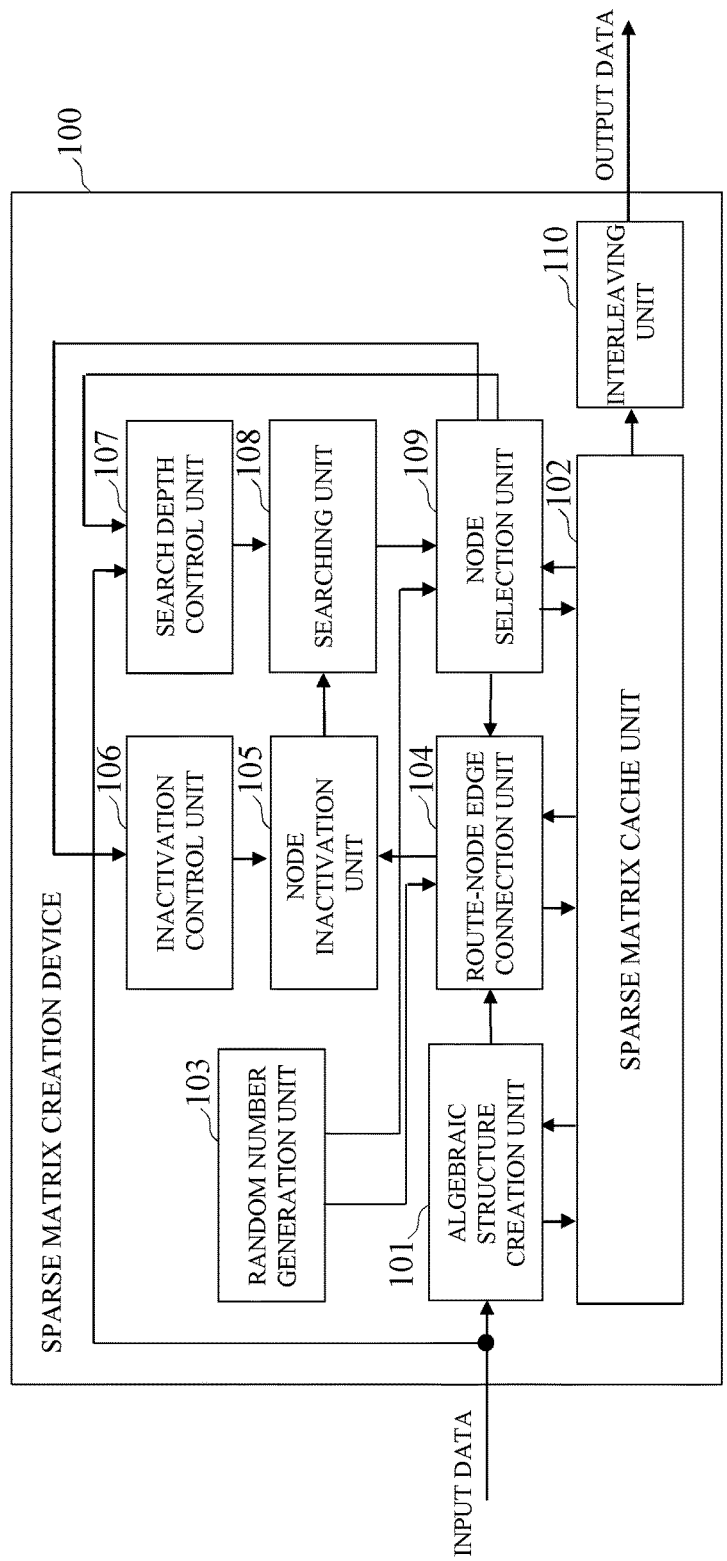
FIG. 3 illustrates an example of a sparse matrix creation device according to a first embodiment.

FIG. 3 illustrates a basic configuration diagram of a sparse matrix creation device according to the embodiment. The sparse matrix creation device 100 according to the embodiment is configured to include an algebraic structure creation unit 101, a sparse matrix cache unit 102, a random number generation unit 103, a route-node edge connection unit 104, a node inactivation unit 105, an inactivation control unit 106, a search depth control unit 107, a searching unit 108, a node selection unit 109, and an interleaving unit 110. The sparse matrix creation device 100 and the sparse graph creation method according to the embodiment implement a rate-adaptive error correction code which achieves multi-level rate control at high efficiency.

The algebraic structure creation unit 101 is considered in the case where the sparse graph has a particular structure. The sparse matrix cache unit 102 stores the sparse matrices which are created. The random number generation unit 103 stochastically configures codes. The route-node edge connection unit 104 selects an edge connected to the route node as a reference in enlarging the loop of the local graph. The node inactivation unit 105 selects nodes which are not considered in enlarging the loop of the local graph. The inactivation control unit 106 determines conditions for the process of the node inactivation unit 105. The search depth control unit 107 controls depths of the nodes which are searched for in enlarging the loop of the local graph. The searching unit 108 searches for the nodes which can be reached through the minimum number of edges from activated nodes connected to the route node based on control information of the search depth control unit 107. The node selection unit 109 selects the nodes satisfying conditions from a result of the searching of the searching unit 108. The condition is, for example, that a check node cannot be reached through any five edges from the route node and the like. The interleaving unit 110 is a constrained interleaving unit which performs exchange such as by column-exchange of the created sparse matrix. Hereinafter, components will be described.

This system is a channel decoding system which efficiently recovers packet erasure occurring on a packet erasure channel. Hereinafter, for the simplification, as one of the best examples where the system operates effectively, an example is described where IP packet transmission on the Internet as a representative packet erasure channel is considered and an LDPC-Staircase code configured with sparse graphs is considered.

When input data are input to the sparse matrix creation device 100, sparse matrix creation is started. As the input data, information necessary for matrix creation such as a size of matrix associated with an encode rate, information on a weight of matrix, and an initial value of a search depth is input. The size of matrix is, for example, a horizontal size and a vertical size. The information on the weight of matrix is, for example, which column is of a column weight of 3 and which column is of a column weight of 7.

First, in the algebraic structure creation unit 101, since the LDPC-Staircase code is considered at this time, a staircase matrix is created to have an algebraic structure. The created staircase matrix is stored in the sparse matrix cache unit 102.

Next, in the route-node edge connection unit 104, the route node in the creation of the local graph and one node are connected to each other through the edge. Herein, the local graph is a graph configured with candidate nodes which are to be connected from the route node in the sparse graph creating process. The route node is a node as a target of addition of a new edge and a node located at the highest position in tree expression.

In the sparse graph creating process, in the case where the route node corresponding to the column is initially selected, various methods of selecting the node connected from the route node through the edge are considered, and for example, a method of calculating row weights and selecting from a set of check nodes having the lightest weight at random is performed. In the case where this constraint is applied, a sparse matrix which is regular in the row direction is created. In the process, the check node which is to be connected from the route node is selected according to the random number generated by the random number generation unit 103.

In the route-node edge connection unit 104, the check node which is to be connected to the route node is selected and connected through the edge, and the procedure proceeds to the node inactivation unit 105. In the node inactivation unit 105, the node which is not included in the searching in the creation of the local graph is designated based on the information of the inactivation control unit 106. However, in the case where there is no particular need for extremely reducing the searching time in the creation of the matrix, there is no merit of inactivating the node, and thus, typically, until a time when the matrix is created, the inactivation control unit 106 does not designate the node which is to be inactivated.

Figure 4:
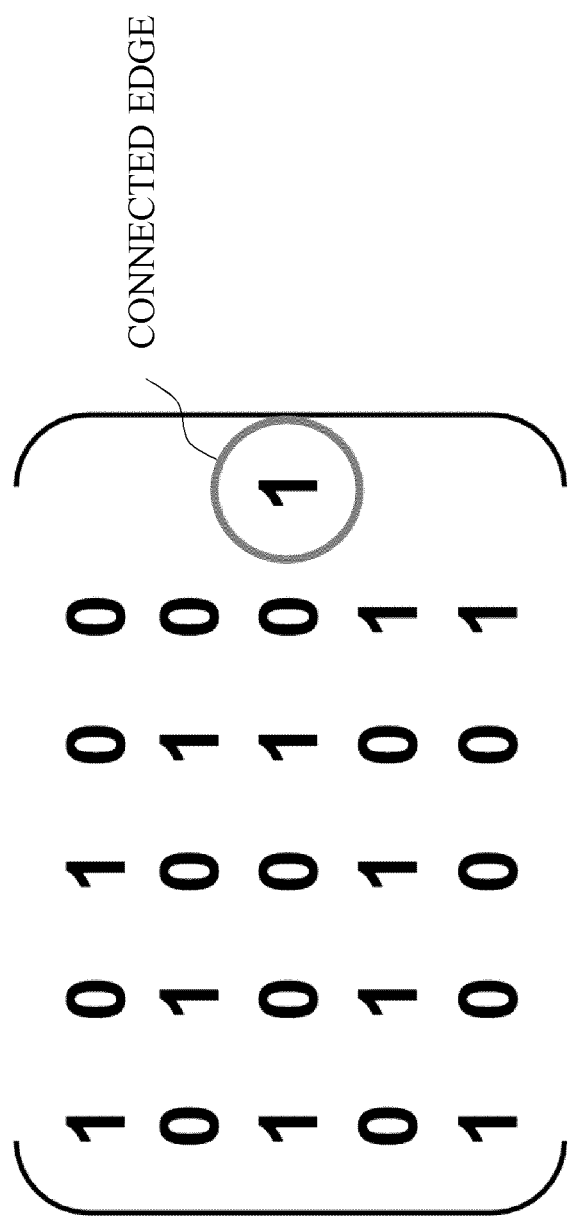
FIG. 4 illustrates an example of a matrix stored in a sparse matrix cache unit 102.

The searching unit 108 performs searching on the activated node which is not inactivated based on the information of the search depth control unit 107. The searching operation will be described with reference to FIGS. 4 and 5. FIG. 4 illustrates an example of a matrix stored in the sparse matrix cache unit 102, and FIG. 5 illustrates a relationship of connection between the route node and the check node which is connected through the minimum number of edges.

Now, it is assumed that the matrix illustrated in FIG. 4 is already created, and the circled "1" is selected as the check node which is connected to the route node in the route-node edge connection unit 104. In addition, it is assumed that all the nodes are in activated state, and the search depth is set to "1". In the embodiment, it is assumed that Depth=1 denotes 1-step searching. In the case, it is assumed that the searching unit 108 performs the 1-step searching. The 1-step searching is to search for the node which is connected to the route node and the active check node through 3 edges (connected through length-3). In the example illustrated in FIG. 5, it can be understood that there are four check nodes connected to a source node $NS_{00}$ corresponding to the route node through length-3, and the first, second, third, and fifth check nodes $NC_{01}$, $NC_{02}$, $NC_{03}$, $NC_{05}$ are connected. In the example of FIG. 4, since the route node and the third check node are connected, "1" cannot be set to the third check node. In this case, in the case where "1" is set to the first, second, and fifth check nodes $NC_{01}$, $NC_{02}$, and $NC_{05}$, a length-4 loop is created so that Depth=1 of FIG. 5 occurs. Herein, the length-4 loop denotes a state of the node arrangement where "1" indicating the node occurs as illustrated in FIG. 6. Since the encoding efficiency is lowered in this arrangement, preferably, the length-4 loop does not exist.

Figure 5:
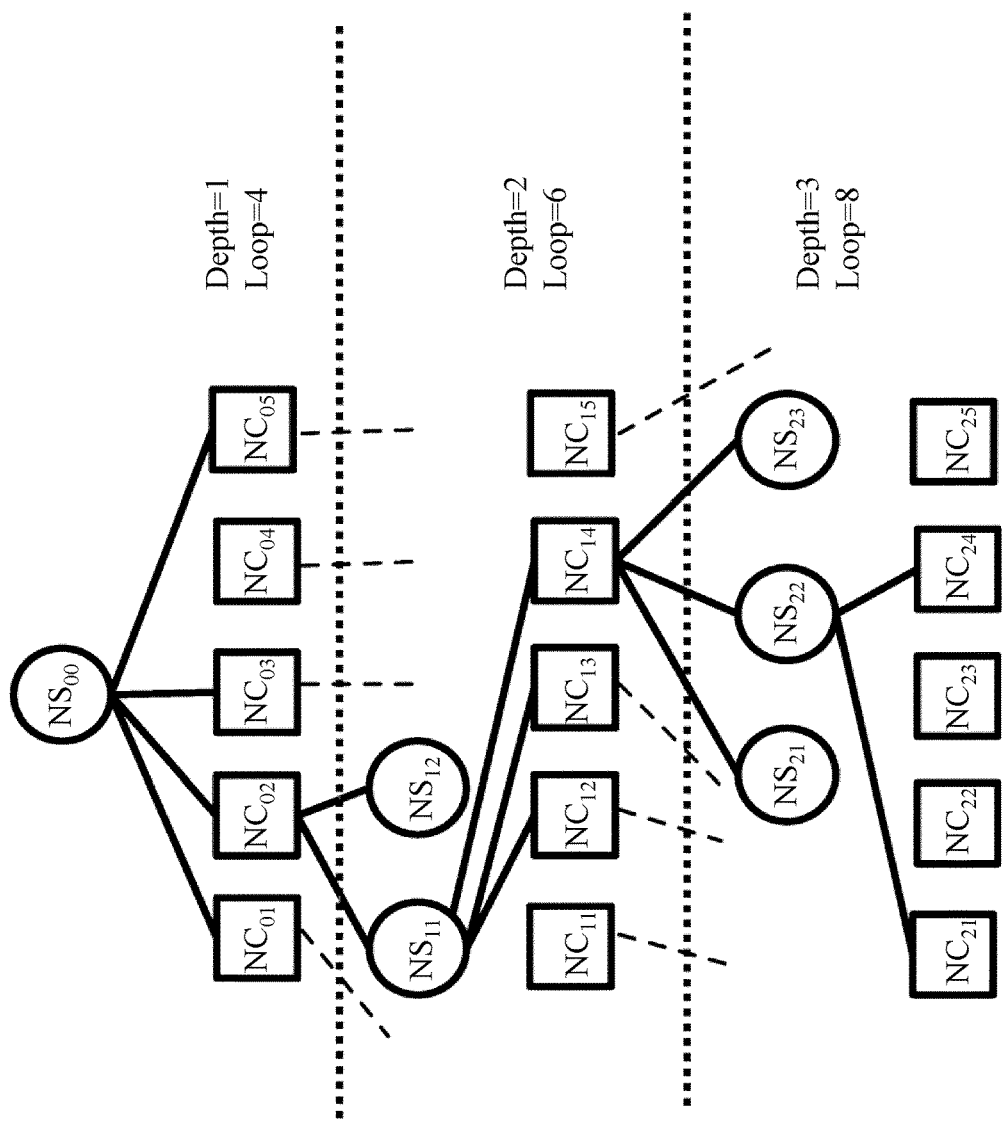
FIG. 5 illustrates an example of tree expansion of a parity check matrix for an LDGM code.
Figure 6:
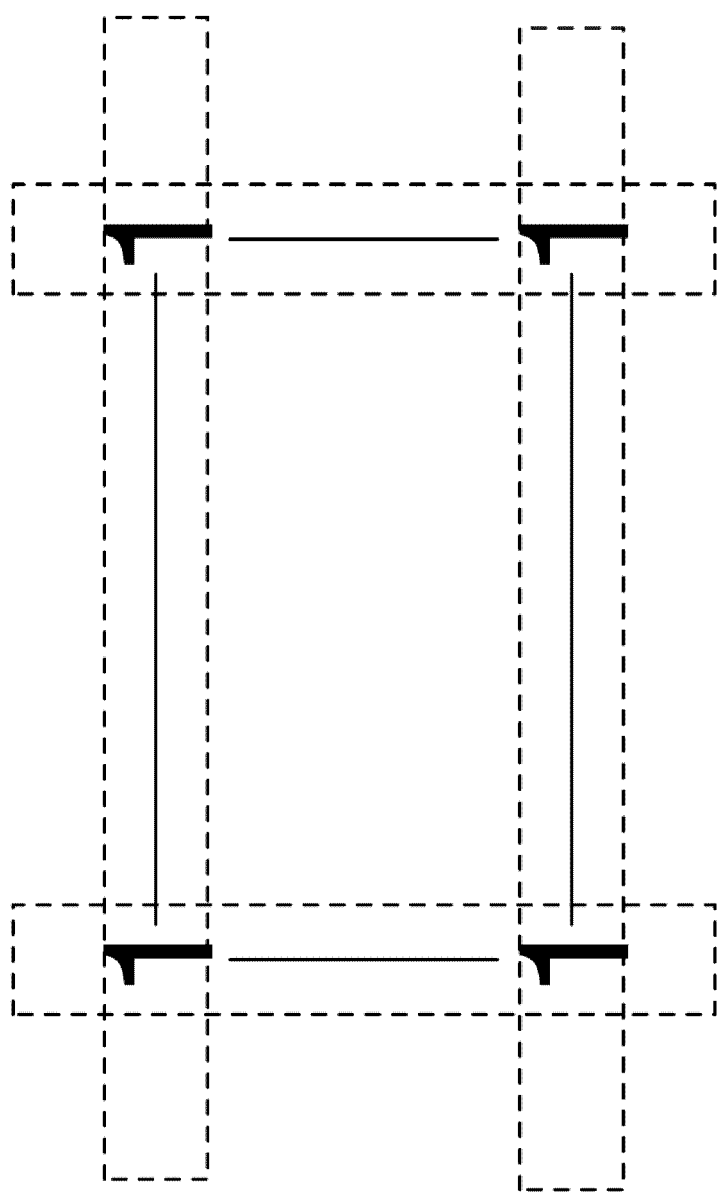
FIG. 6 illustrates an example of a length-4 loop.
Figure 7:
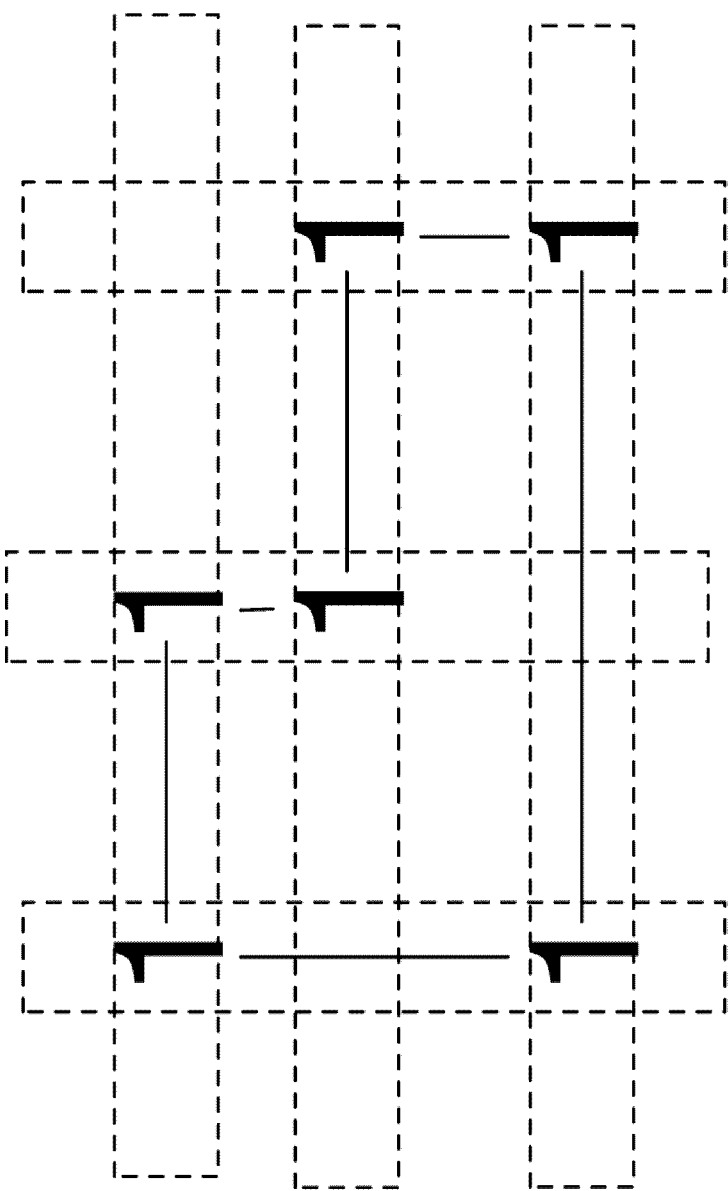
FIG. 7 illustrates an example of a length-6 loop.

In addition, in the case of performing 2-step searching, the check node which can be reached through five edges is searched for, and since the edge also reaches the fourth check node, in the arrangement of the nodes illustrated in FIG. 5, the selection of the check node avoiding the length-6 loop as illustrated in FIG. 7 cannot be performed.

The node selection unit 109 receives a result of the searching of the searching unit 108 and determines the position of to-be-added node. For example, the nodes are nodes which cannot be reached from the route node through any three edges. In the case where there are multiple candidates for selection, used are methods such as a method of selecting from a candidate node set at random, a method of filling from a top portion of a matrix, or a method of filling from a portion having a small row weight. In addition, in the case of selecting the node at random, the random number generated by the random number generation unit 103 is used.

If one node is selected by the node selection unit 109, the procedure returns to the route-node edge connection unit 104, the edge for the node selected by the node selection unit 109 is added, and the same processes as 105, 108, and 109 are performed.

If an arbitrary number of nodes (e.g., three nodes) are created and column process is ended, the selected node is stored in the sparse matrix cache unit 102.

In addition, in the case where there is no node which can be selected by the node selection unit 109 in the performing of the process (there is no candidate satisfying the conditions), the search depth control unit 107 changes the search depth to narrow the search range, or the nodes inactivated by the inactivation control unit 106 are selected, so that the process of decreasing the activated nodes as search targets is performed. This process may be performed side by side or simultaneously, and for example, the search depth control unit 107 changes the search depth, and in the case where there is no node which can be selected in the 1-step searching, a method of changing the settings of the inactivation control unit 106 to inactivate the nodes which are created until the time and enlarging the search depth of the search depth control unit 107 again to continue to perform the matrix creation is effectively used.

Figure 8:
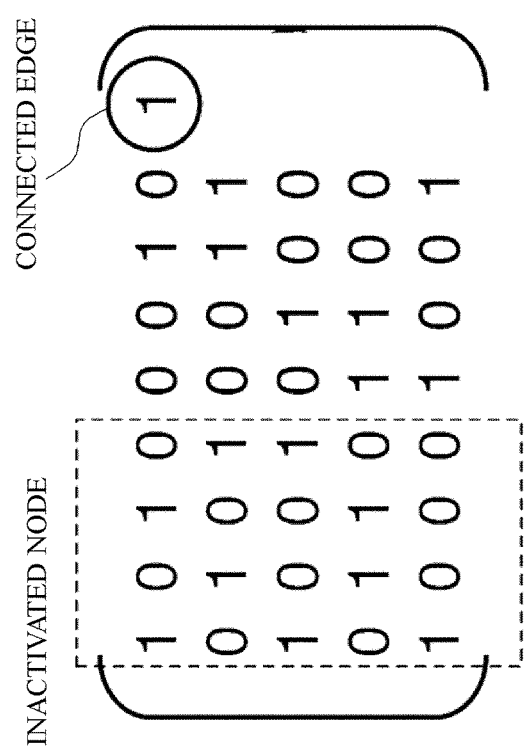
FIG. 8 illustrates an example of inactivation.
Figure 8:
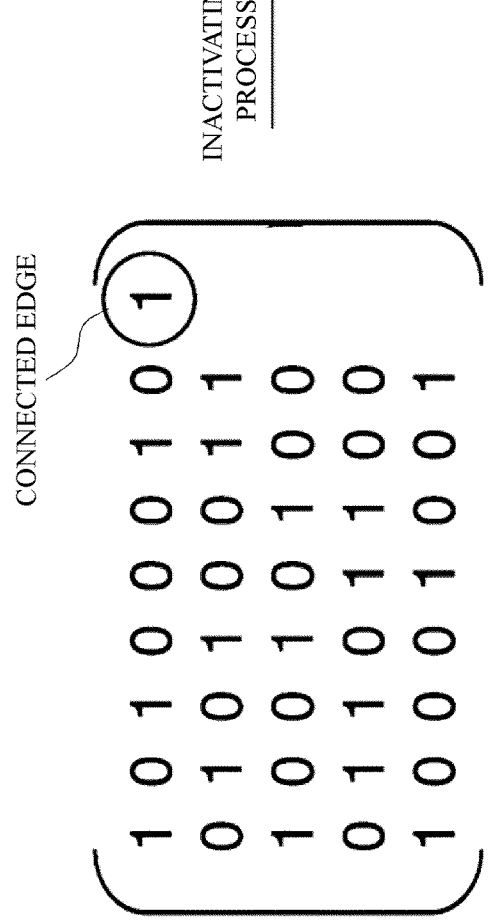

The process of the node inactivation unit 105 will be described with reference to FIG. 8. The matrix in the left portion of FIG. 8 is a matrix which is obtained in the performing of the matrix creation. Now, the ninth node is to be created, and the first check node is selected as the route node. However, in the performing of the 1-step searching, all other check nodes including the second, third, fourth, and fifth check nodes are connected through the length-3 edge, and thus, although any node is selected, the length-4 loop occurs. Therefore, the inactivation control unit 106 determines that half of the nodes which are already created are to be activated, and the node inactivation unit 105 inactivates the first to fourth nodes (the right portion of FIG. 8). Due to the inactivation, any one of the third, fourth, and fifth check nodes can be selected. Therefore, in the sparse matrix creation device 100 according to the embodiment, even in the case where a portion of the created matrices is used, excellent encoding efficiency can be achieved, and such as by changing the to-be-inactivated node according to the column weight, the sparse matrix having good encoding efficiency can be speedily and efficiently created. In addition, the to-be-inactivated node is arbitrarily changed according to the rate-adaptive parameters, or the like. For example, in this embodiment, since a degree of demands for the node corresponding to the staircase matrix is high, preferably, the node is not inactivated, but the node is always maintained active.

Finally, if the elements of the sparse matrix are completely obtained, the created sparse matrix is transmitted to the interleaving unit 110. In the interleaving unit 110, even in the case where cutting is performed within an arbitrary range, column rearrangement is performed so that a loop is wide and matrix weights are averaged, and the sparse matrix information is output as output data.

Second Embodiment

In this embodiment, in a selective PEG algorithm, creation of a sparse matrix is performed while maintaining row weight/column weight at an arbitrary multi-level, and in the process, by performing constrained interleaving, encoding efficiency of the case where a matrix space is narrow is improved.

The sparse graph creation method according to the embodiment is configured to sequentially include a searching process, a node selecting process, a route node edge connecting process, and a constrained interleaving process.

In the searching process, a node which can be reached through the minimum number of edges from activated nodes connected to an arbitrary route node which becomes a route in creation of a local graph is searched for from a sparse graph.

In the node selecting process, the nodes satisfying predetermined conditions are selected from a result of the searching.

In the route node edge connecting process, the nodes selected in the node selecting process and the route node are connected to each other.

In the constrained interleaving process, each nodes of the sparse graph where the nodes are created at selected positions are rearranged to maintain the relationship of the local graph so that each weights of the sparse matrices are uniformly distributed in terms of a space.

Figure 9:
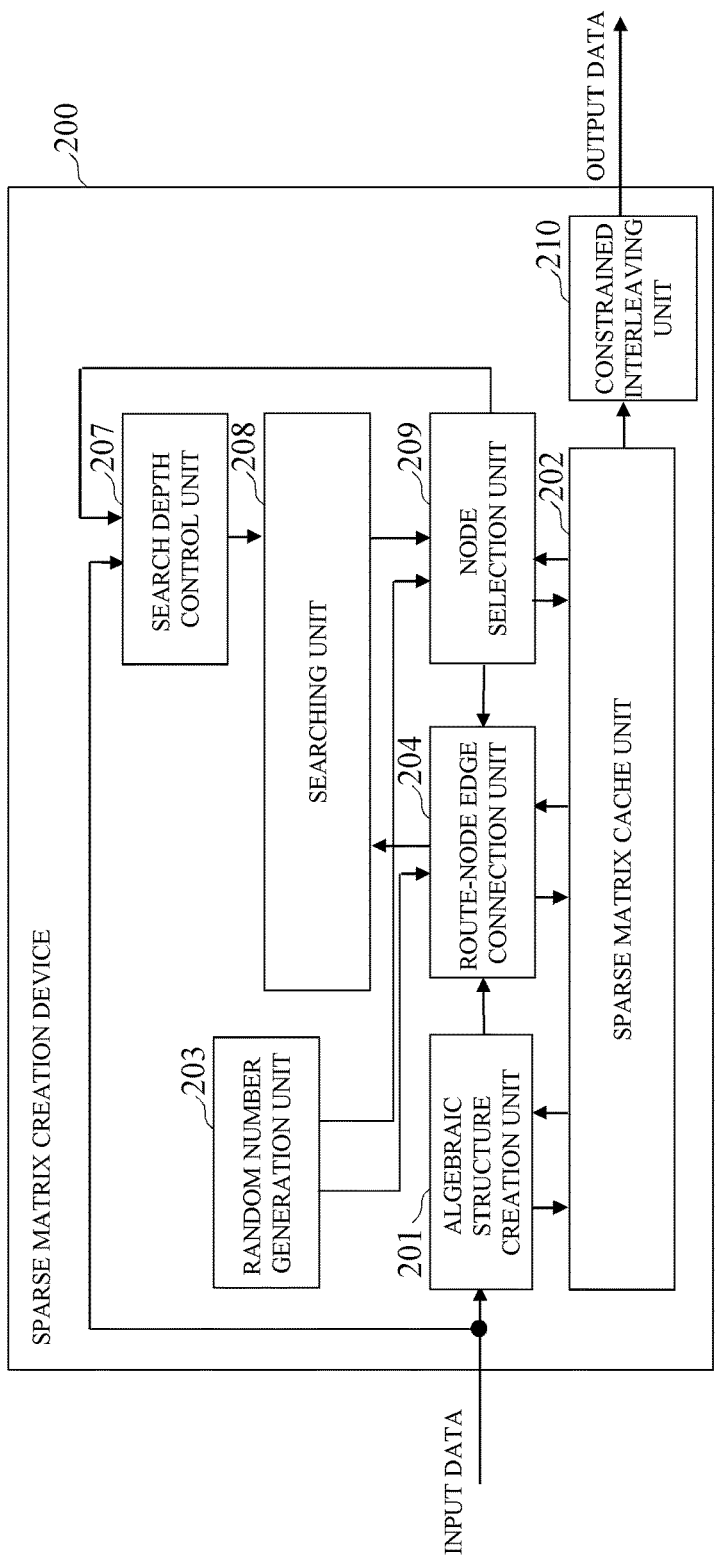
FIG. 9 illustrates an example of a sparse matrix creation device according to a second embodiment.

FIG. 9 illustrates a basic configuration diagram of a sparse matrix creation device according to the embodiment. The sparse matrix creation device 200 according to the embodiment is configured to include an algebraic structure creation unit 201, a sparse matrix cache unit 202, a random number generation unit 203, a route-node edge connection unit 204, a searching unit 208, a search depth control unit 207, a node selection unit 209, and a constrained interleaving unit 210. The sparse matrix creation device 200 according to the embodiment implements a rate-adaptive error correction code which achieves The algebraic structure creation unit 201 is considered in the case where the sparse graph has a particular structure. The sparse matrix cache unit 202 stores the sparse matrices which are created. The random number generation unit 203 stochastically configures codes. The route-node edge connection unit 204 selects an edge connected to the route node as a reference in enlarging the loop of the local graph. The searching unit 208 searches for the nodes which can be reached through the minimum number of edges based on control information of the search depth control unit 207. The search depth control unit 207 controls a search depth by using the searching unit 208. The node selection unit 209 selects the nodes satisfying conditions from a result of the searching. The constrained interleaving unit 210 performs exchange such as by column-exchange of the created sparse matrices. Hereinafter, each components will be described.

This system is a channel decoding system which efficiently recovers packet erasure occurring on a packet erasure channel. Hereinafter, for the simplification, as one of the best examples where the system operates effectively, an example is described where IP packet transmission on the Internet as a representative packet erasure channel is considered and an LDPC-Staircase code configured with sparse graphs is considered.

When input data are input to the sparse matrix creation device 200, sparse matrix creation is started. As the input data, information necessary for matrix creation such as a size (e.g., horizontal size and vertical size) of matrix associated with an encode rate, information (e.g., which column is of a column weight of 3 and which column is of a column weight of 7) on a weight of matrix, and an initial value of a search depth is input.

First, in the algebraic structure creation unit 201, since the LDPC-Staircase code is considered at this time, a staircase matrix is created to have an algebraic structure. The created staircase matrix is stored in the sparse matrix cache unit 202.

Next, in the route-node edge connection unit 204, the node connected from the node which becomes the route node in the creation of the local graph is connected through the edge. In the case where the edge which is connected from the route node to the check node is initially selected as the column, various methods of selecting the edge are considered, and for example, a method of calculating row weights and selecting from a set of check nodes having the lightest weight at random is performed. In the case where this constraint is applied, a sparse matrix which is regular in the row direction is created. In the process, the check node is selected according to the random number generated by the random number generation unit 203 and is connected through the edge.

If the edge is connected from the route node by the route-node edge connection unit 204, the searching unit 208 performs searching based on the information of the search depth control unit 207. Since the operations of the searching unit 208 are the same as those of the searching unit 108 described in the first embodiment, detailed description of the searching operations is omitted herein.

The node selection unit 209 receives a result of the searching of the searching unit 208 and determines to-be-added nodes. In the case where there are multiple candidates for selection, used are methods such as a method of selecting from a candidate node set at random, a method of filling from a top portion of a matrix, or a method of filling from a portion having a light row weight. In addition, in the case of selecting the node at random, the random number generated by the random number generation unit 203 is used.

If one node is selected by the node selection unit 209, the procedure returns to the route-node edge connection unit 204, the selected edge is allowed to be connected with the route node, and the same processes as the searching unit 208 and the node selection unit 209 are performed, the arbitrary number of nodes (e.g. three nodes) are created, and the processes are repeated until the column process is ended. After that, the selected node is stored in the sparse matrix cache unit 202.

In addition, in the case where there is no node which can be selected by the node selection unit 209 in the performing of the process (there is no candidate satisfying the conditions), like the first embodiment, the search depth control unit 207 changes the search depth to narrow the search range. However, in some cases, although the search range is narrowed, the node which can be selected by the node selection unit 204 does not occur. In this case, the search depth control unit 207 controls the searching not to be performed, and the searching unit 208 is skipped, so that a sparse matrix having an arbitrary weight is created.

Figure 10:
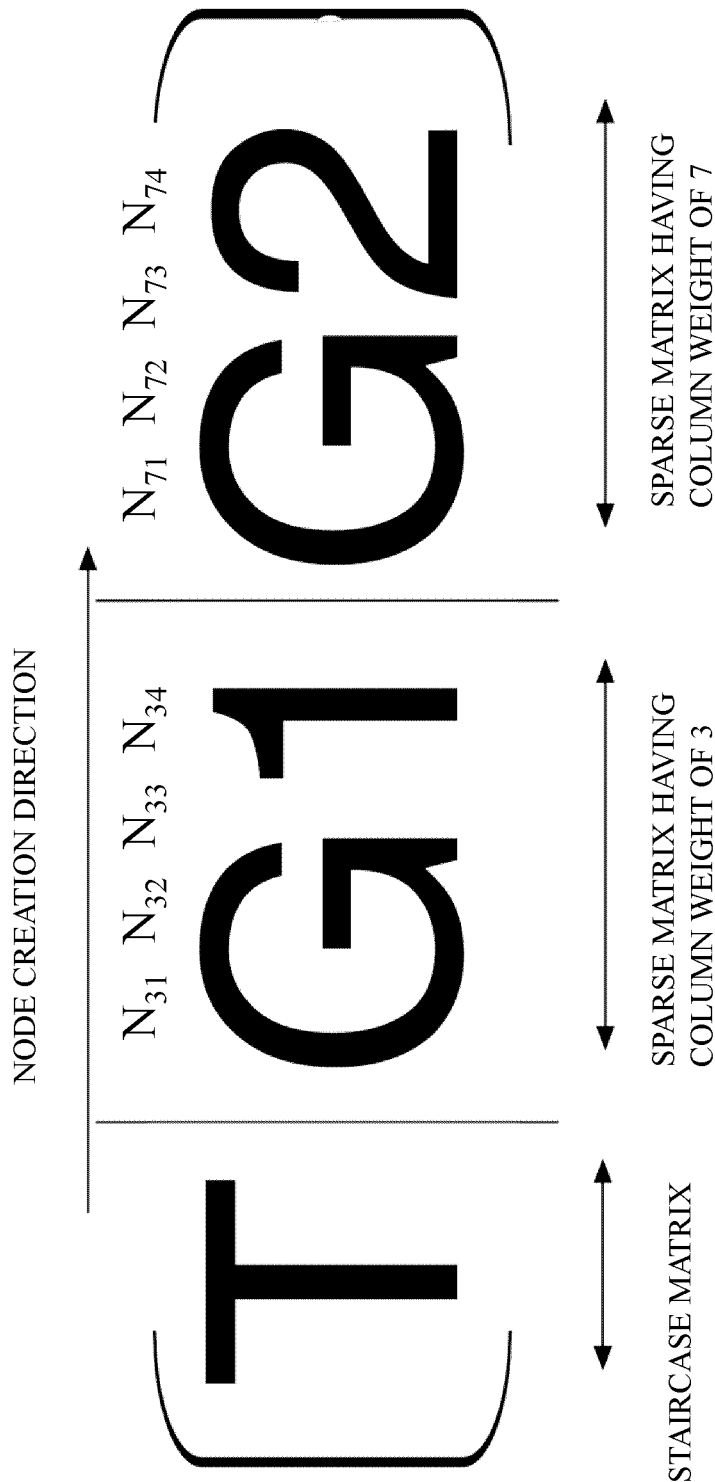
FIG. 10 illustrates an example of a before-interleaving matrix.
Figure 11:
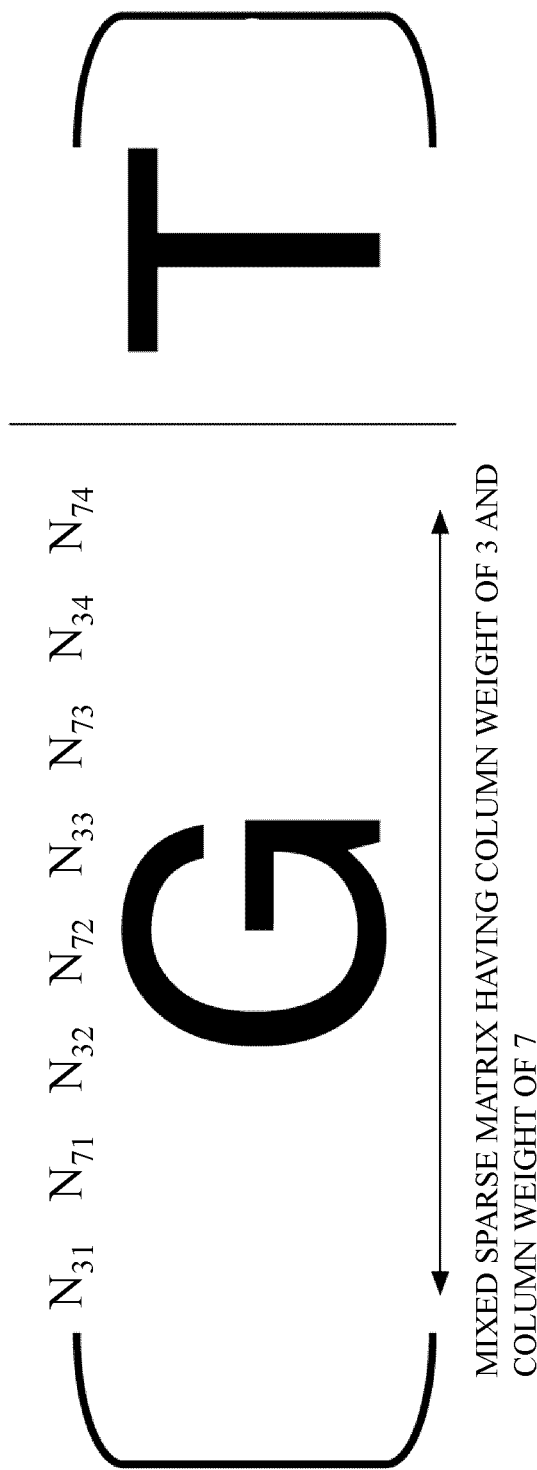
FIG. 11 illustrates an example of an after-interleaving matrix.

In addition, in this embodiment, in the case of creating an irregular matrix, first, a column (e.g. a column having a column weight of 3) having light weight is configured to be created, and after that, a column (e.g. a column having a column weight of 7) having heavy weight is configured to be created, so that a matrix having good encoding efficiency can be created. FIGS. 10 and 11 illustrate examples of sparse matrices stored in the sparse matrix cache unit 202 after the selection of nodes of the entire sparse matrix is performed. First, the sparse matrix includes a staircase matrix created by the algebraic structure creation unit 201 at the left portion; next, a sparse matrix having a column weight of 3 follows; and finally, a sparse matrix having a column weight of 7 follows.

Finally, if the elements of the sparse matrix are completely obtained, the created sparse matrix is transmitted to the constrained interleaving unit 210, and column rearrangement is performed so that, even in the case where cutting is performed within an arbitrary range, a loop is wide and matrix weights are averaged, and the sparse matrix information is output as output data. The constrained interleaving unit 210 can rearrange, for example, the sparse matrix illustrated in FIG. 10 to the matrix illustrated in FIG. 11.

Namely, the staircase matrix indicated by "T" in FIG. 10 is located at the right side of a parity check matrix. In addition, in FIG. 10, a mixed sparse matrix "G" indicated in FIG. 11 is created by the sparse matrix having a column weight of 3 indicated by "G1" and the sparse matrix having a column weight of 7 indicated by "G2". The mixed sparse matrix "G" can be obtained by mixing so that the sparse matrix having a column weight of 3 and the sparse matrix having a column weight of 7 are averaged over the space and the average thereof is uniform.

In addition, at the same time, the mixed sparse matrix "G" maintains an order relationship within the sparse matrix having a column weight of 3 and within the sparse matrix having a column weight of 7. Namely, nodes $N_{31}$, $N_{32}$, $N_{33}$, and $N_{34}$ having a column weight of 3 and nodes $N_{71}$, $N_{72}$, $N_{73}$, $N_{74}$ having a column weight are arranged in the order of $N_{31}$, $N_{71}$, $N_{32}$, $N_{72}$, $N_{33}$, $N_{73}$, $N_{34}$, and $N_{74}$ in the mixed sparse matrix "G". In this manner, by performing the constrained interleaving, for example, although the rate variation is performed to fourth node by a process of filling with 0s to change the length about the source, the process is performed so that excellent encoding performance is maintained.

Figure 12:
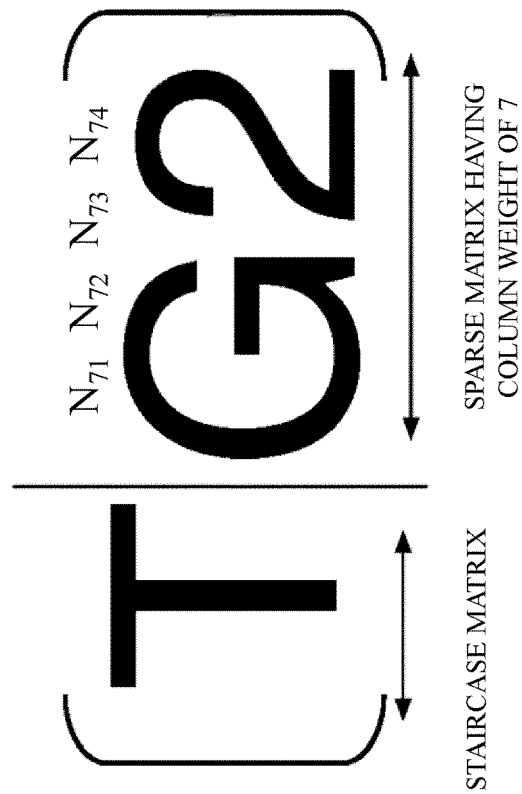
FIG. 12 illustrates an example of two before-interleaving matrices.
Figure 12:
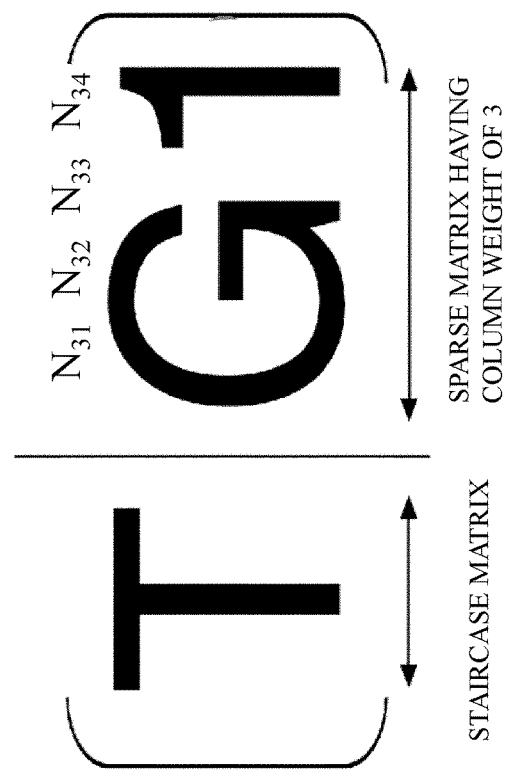

In addition, the constrained interleaving unit 210 may create one sparse matrix by mixing two sparse matrices. FIG. 12 illustrates two sparse matrices having different column weights which are created by the sparse matrix creation device according to the embodiment. Even in this case, by the constrained interleaving unit 210, the sparse matrix having a column weight of 3 and the sparse matrix having a column weight of 7 can be mixed as a mixed sparse matrix "G" having a column weight of 3 and a column weight of 7 as illustrated in FIG. 11, and the staircase matrix is rearranged to be located at the right side.

In this embodiment, since the node inactivation unit 105 of the first embodiment is not included, a function similar to that of the node inactivation unit 105 of the first embodiment can be obtained by creating a plurality of the sparse matrices.

Third Embodiment

Figure 13:
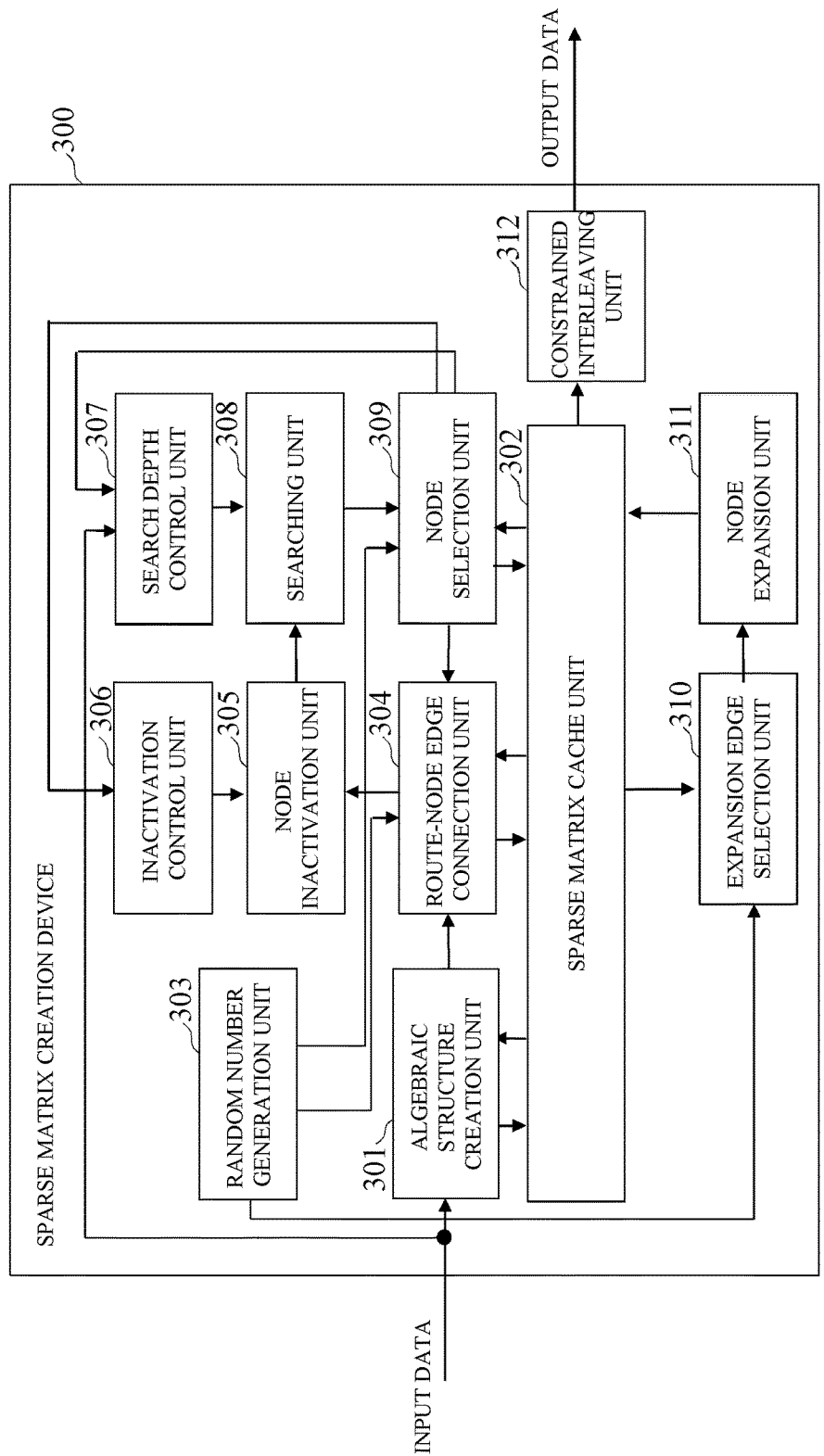
FIG. 13 illustrates an example of a sparse matrix creation device according to a third embodiment.

FIG. 13 illustrates a basic configuration diagram of a sparse matrix creation device according to an embodiment. The sparse matrix creation device 300 according to the embodiment implements a rate-adaptive error correction code which achieves multi-level rate control with high efficiency. The sparse matrix creation device 300 according to the embodiment is configured to include an algebraic structure creation unit 301, a sparse matrix cache unit 302, a random number generation unit 303, a route-node edge connection unit 304, a node inactivation unit 305, an inactivation control unit 306, a search depth control unit 307, a searching unit 308, a node selection unit 309, an expansion edge selection unit 310, a node expansion unit 311, and a constrained interleaving unit 312.

The algebraic structure creation unit 301 is considered in the case where a sparse graph has a particular structure. The sparse matrix cache unit 302 stores sparse matrices which are created. The random number generation unit 303 stochastically configures codes. The route-node edge connection unit 304 connects through an edge the node which is to be connected from a node as a route in creation of a local graph. The node inactivation unit 305 selects a node which is not considered in enlarging the loop of the local graph. The inactivation control unit 306 determines conditions of a process of the node inactivation unit 305. The search depth control unit 307 controls a depth of search in enlarging the loop of the local graph. The searching unit 308 searches for the node which can be reached through the minimum number of edges from activated nodes connected to the route node based on control information of the search depth control unit 307. The node selection unit 309 selects the node satisfying the conditions from a result of the searching of the searching unit 308. The expansion edge selection unit 310 selects the edge which proceeds to the expanded check node. The node expansion unit 311 increases the number of check nodes in the state where the number of edges in the sparse graph is maintained. The constrained interleaving unit 312 performs exchange such as by column exchange of the created sparse matrix. Hereinafter, the each components will be described.

The system is a channel decoding system which efficiently recovers packet erasure occurring on a packet erasure channel. Hereinafter, for the simplification, as one of the best examples where the system operates effectively, an example is described where IP packet transmission on the Internet as a representative packet erasure channel is considered and an LDPC-Staircase code configured with sparse graphs is considered. In addition, in this embodiment, an example specialized in a rate variation capable of greatly changing redundancy is described.

When input data are input to the sparse matrix creation device 300, sparse matrix creation is started. As the input data, information necessary for matrix creation such as a size (e.g., horizontal size and vertical size) of matrix associated with an encode rate, information (e.g., which column is of a column weight of 3 and which column is of a column weight of 7) on a weight of matrix, and an initial value of a search depth is input. In addition, as parameters corresponding to rate variation, information such as minimum matrix size or maximum matrix size, and each redundancy rate is input.

Figure 14:
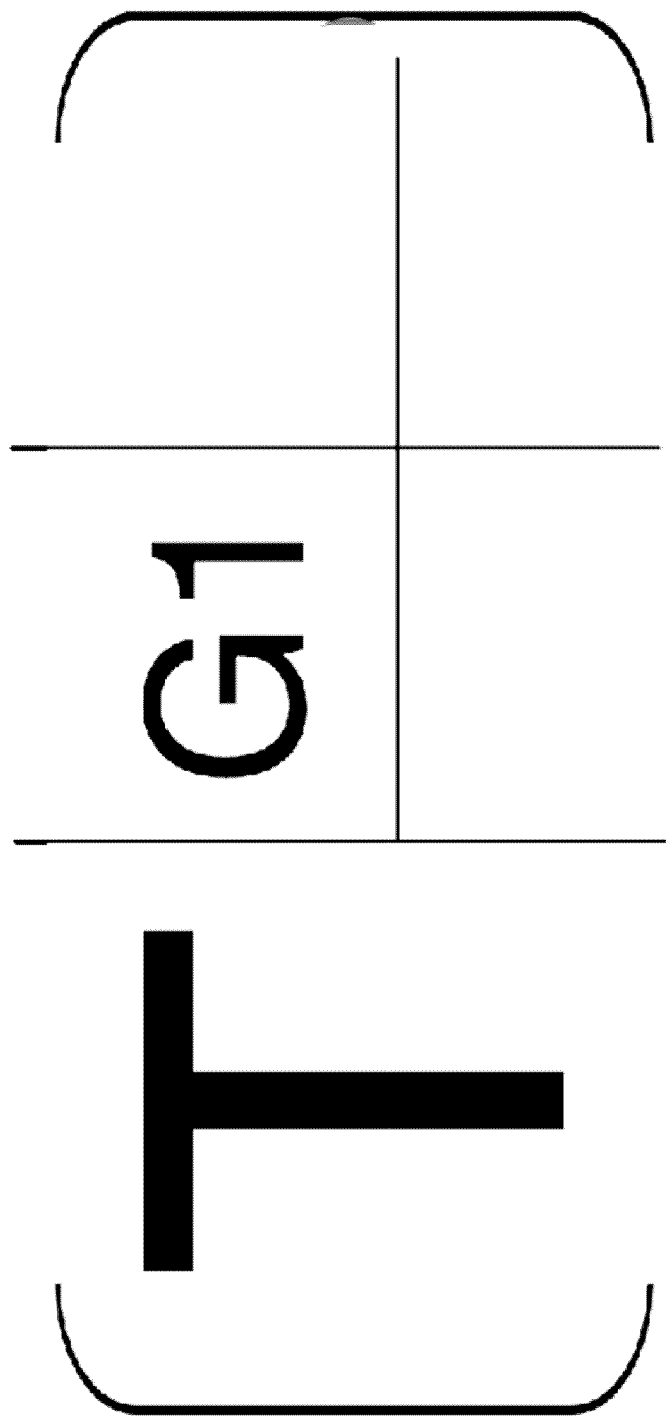
FIG. 14 illustrates an example of a process of creating a rate-adaptive sparse matrix and a small sparse matrix which is created.
Figure 15:
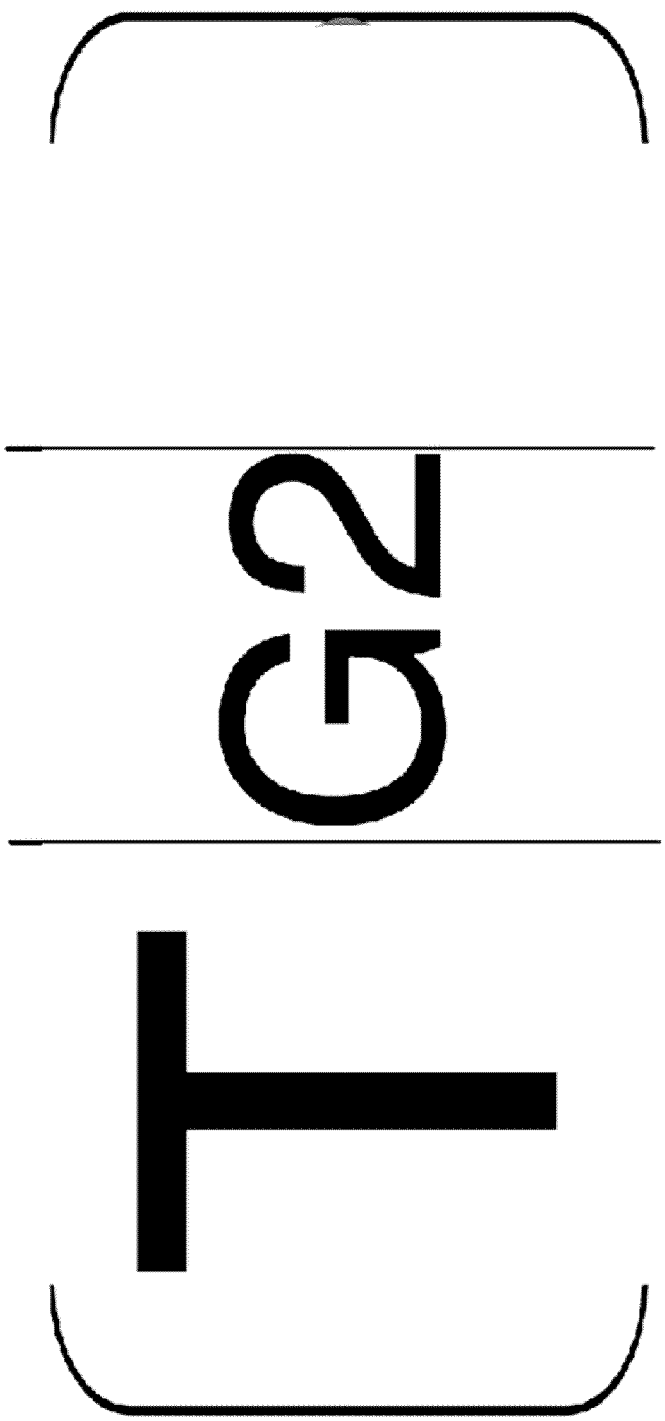
FIG. 15 illustrates an example of the process of creating the rate-adaptive sparse matrix and a small sparse matrix which is expanded.
Figure 16:
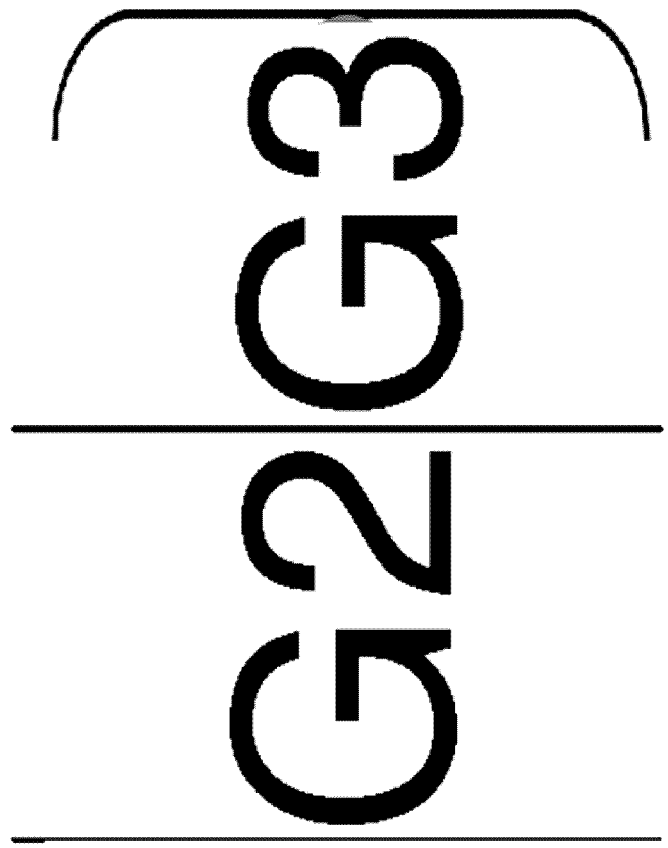
FIG. 16 illustrates an example of the process of creating the rate-adaptive sparse matrix and a small sparse matrix which is column-expanded.

Since the processes from the process of the algebraic structure creation unit 301 to the process of the node selection unit 309 are basically the same as those of the components 101 to 109 of the first embodiment, detailed description thereof is omitted, and in order to create a matrix corresponding to the rate variation, in the node selection of the route-node edge connection unit 304 and the node selection unit 309, the node is selected so that the matrix size is included within a range of the minimum matrix size, and the connection is performed through the edge. Namely, as illustrated in FIG. 14, the region where the node is selected is restricted to create a small sparse matrix, and the sparse matrix is stored in the sparse matrix cache unit 302. In addition, in FIGS. 14 to 17, G1 is a sparse matrix having an arbitrary weight, and a regular matrix, an irregular matrix, or other various matrices can be produced.

Figure 18:
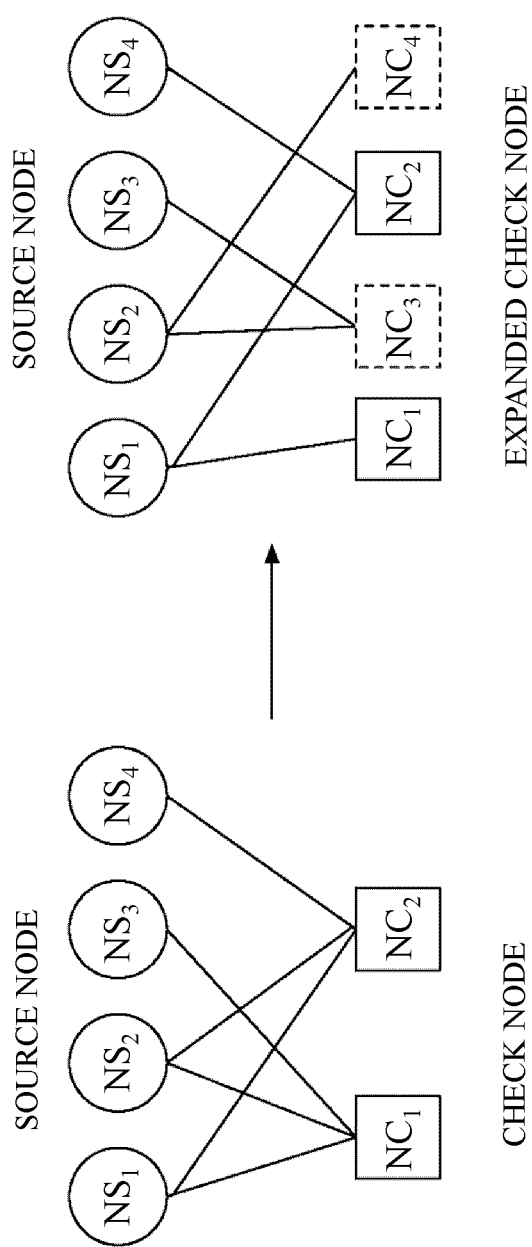
FIG. 18 illustrates an example of expansion of nodes.

Next, the created small sparse matrix expands check nodes by using the expansion edge selection unit 310 and the node expansion unit 311. Although various expansion methods can be considered, herein, a method is used where only the number of check nodes is changed without change in the number of source nodes and the number of edges. FIG. 18 illustrates an overview of the process. The left diagram of FIG. 18 illustrates a state before the expansion of G1 of FIG. 14. The expansion edge selection unit 310 selects expansion edges. Namely, in FIG. 18, among the edges connected to the $NC_1$ and the $NC_2$, the to-be-expanded edges are selected. Next, the node expansion unit 311 additionally installs the check nodes $NC_3$ and $NC_4$ and re-attaches the edges selected by the expansion edge selection unit 310 thereto. Therefore, as illustrated in the right diagram of FIG. 18, the check nodes $NC_3$ and $NC_4$ are added.

In the expansion, in the expansion edge selection unit 310, the selection as to which edge is connected to the expanded node (or whether the edge still remains connected to the check node) is performed at random according to the random number generated by the random number generation unit 303. In addition, in this process, the expansion edges are selected so that the number of edges connected to any check nodes is roughly the same. In response to the edge selection, the node expansion unit 311 performs the check node expansion. As a result of the expansion, G1 of FIG. 14 becomes G2 of FIG. 15, so that a sparse graph structure where the number of check nodes is increased is obtained. The expanded sparse matrix is stored in the sparse matrix cache unit 302.

After that, the node creation in the column direction continues to be performed. The processes are the same as the above processes, and the column creating processes of from the route-node edge connection unit 304 to the node selection unit 309 are performed. At this time, in the route-node edge connection unit 304 and the node selection unit 309, the space restriction which is applied in the above-described processes is not applied. Therefore, like G3 illustrated in FIG. 16, a partial sparse matrix of which the region is not restricted is created.

Figure 17:
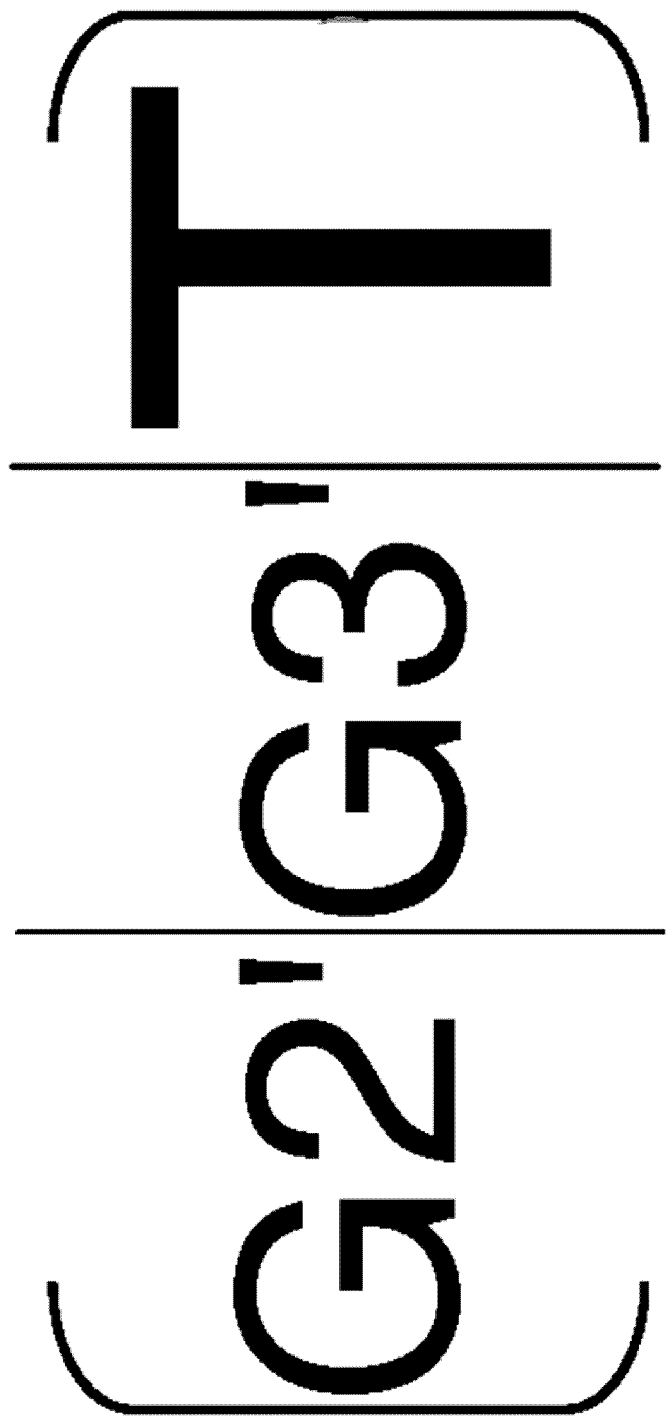
FIG. 17 illustrates an example of the process of creating the rate-adaptive sparse matrix and an after-constrained-interleaving sparse matrix.

Finally, if the elements of the sparse matrix are completely obtained, the created sparse matrix is transmitted to the constrained interleaving unit 312, and column rearrangement is performed so that, even in the case where cutting is performed within an arbitrary range, a loop is wide and matrix weights are averaged, and the sparse matrix information is output as output data. For example, as illustrated in FIG. 17, the sparse matrices G2 and G3 are rearranged so that the column weights are equalized, and thus, sparse matrices G2' and G3' are obtained. In the sparse matrix G2' and G3', like the constrained interleaving illustrated in FIGS. 10 and 11, the constrained interleaving is performed where the column exchange is not performed for the columns having the same column weight. According to the configuration, in the case where the rate is varied by filling with 0s from the right side of G3' or in the case where the rate is varied by a puncture process on G2', a matrix can be created with high encoding efficiency.

In addition, in this embodiment, although the simple rate-adaptive example is described, the embodiment can be easily modified as a method of creating a matrix coping with rate variation to a multi-rate.

Figure 19:
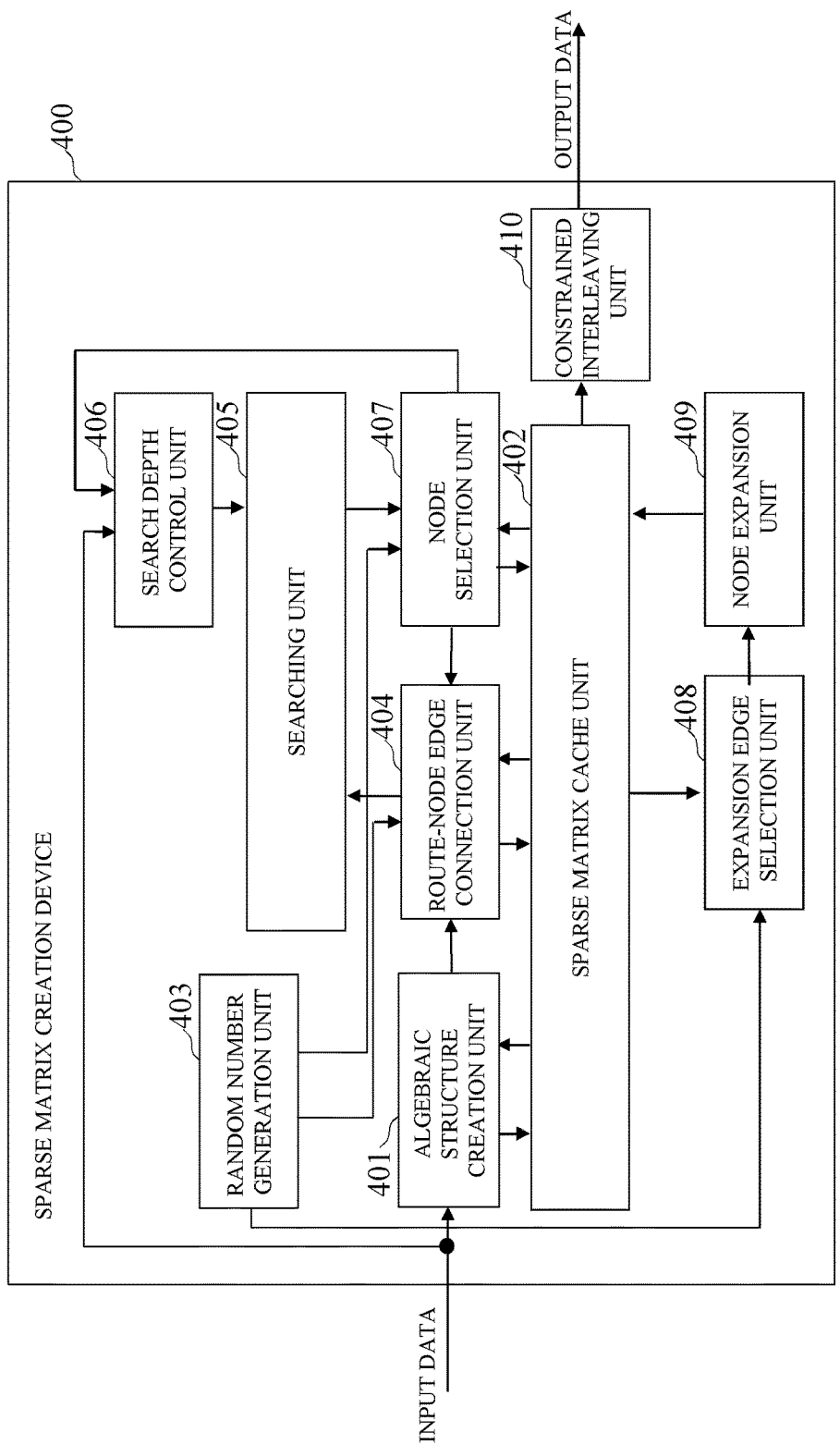
FIG. 19 illustrates a second configuration example of a sparse matrix creation device according to a third embodiment.

In this embodiment, although the example where the configuration of the first embodiment is added with the expansion edge selection unit 310 and the node expansion unit 311 is described, the embodiment is not limited thereto. For example, as illustrated in FIG. 19, the configuration of the second embodiment may be added with the expansion edge selection unit 310 and the node expansion unit 311.

In addition, the disclosure according to the embodiment includes the configuration of the first embodiment and the constrained interleaving function described in the second embodiment. In this manner, the disclosure of the first embodiment and the disclosure of the second embodiment may be combined. According to this combination, the encoding efficiency can be further improved.

As clarified from the above description, according to the present disclosure, in creation of a sparse matrix in a sparse graph code, a sparse matrix implementing a rate-adaptive error correction code achieving multi-level rate control at high efficiency can be created.

INDUSTRIAL APPLICABILITY

The present disclosure can be applied to information communication industries.

REFERENCE SIGNS LIST

10: sparse matrix creation unit
91: channel encoding device
92: packet-based transmission device
93: packet-based receiver device
94: channel decoding device
100, 200, 300, 400: sparse matrix creation device
101, 201, 301, 401: algebraic structure creation unit
102, 202, 302, 402: sparse matrix cache unit
103, 203, 303, 403: random number generation unit
104, 204, 304, 404: route-node edge connection unit
105, 305: node inactivation unit
106, 306: inactivation control unit
107, 207, 307, 406: search depth control unit
108, 208, 308, 405: searching unit
109, 209, 309, 407: node selection unit
110: interleaving unit
210, 312, 410: constrained interleaving unit
310, 408: expansion edge selection unit
311, 409: node expansion unit
911: channel encoding unit
921: packet transmission unit
931: received data analyzing unit
941: channel decoding unit

What is claimed is:

1. A device for creating a sparse matrix used for a sparse graph code to recover a packet erased in a communication channel, the device comprising:
- an inactivation unit which inactivates arbitrary columns of the sparse matrix when there is no node which can be selected during the creating of the sparse matrix,
- wherein the sparse matrix is used for encoding or decoding transmission data in a channel encoding or decoding device, wherein the sparse matrix has columns that are generated in sequence and wherein the sparse matrix comprises a column that corresponds to an information node of a sparse graph, a row that corresponds to a check node of the sparse graph, and one stand location that corresponds to an edge connecting the information node and the check node of the sparse graph;
- a searching unit that searches for a target node of a local graph, wherein the target node is a node which cannot be reached through a minimum number of edges when adding route nodes that are new nodes corresponding to the column of the sparse matrix, and
- wherein the searching is performed by setting an active node not inactivated by the inactivation unit from within the sparse matrix as a target and setting the route node as a starting point;
- a node selection unit that receives a result of the searching performed by the searching unit and determines a position on the local graph for creating an edge,
- wherein the position is a selected node where the target node that is searched for and the route node are connected; and
- a sparse matrix cache unit that stores the selected node in the sparse matrix when an arbitrary number of nodes are created and a column process is ended, whereby the sparse matrix can be used for the sparse graph code when encoding or decoding transmission data to recover a packet erased in the communication channel.

2. The device according to claim 1, the device further comprising a node expansion unit which installs a new node so that a total number of edges of the sparse graph is not changed and a minimum loop is not shortened.

3. A method for creating a sparse matrix used for a sparse graph code to recover a packet erased in a communication channel, the sparse matrix having columns that are generated in sequence, the method sequentially comprising:
- inactivating, by an inactivation unit, arbitrary columns of the sparse matrix when there is no node which can be selected during the creating the sparse matrix wherein the sparse matrix has a column that correspond to an information node of a sparse graph, the sparse matrix having a row that corresponds to a check node of the sparse graph, and the sparse matrix having and one stand location that corresponds to an edge connecting the information node and the check node of the sparse graph;
- searching, by a searching unit, for a target node of a local graph,
- wherein the searching is performed by setting an active node not inactivated by the inactivation unit from within the sparse matrix as a target and setting a route node as a starting point,
- wherein the target node is a node which cannot be reached through a minimum number of edges when adding route nodes that are new nodes corresponding to the column of the sparse matrix;
- receiving, by a node selection unit, a result of the searching and determining a position on the local graph for creating an edge,
- wherein the position is a selected node where the target node which is searched for and the route node are connected; and
- storing, by a sparse matrix cache unit, the selected node in the sparse matrix when an arbitrary predesignated number of nodes are created and the column generating is ended, whereby the sparse matrix can be used for the sparse graph code when encoding or decoding transmission data to recover a packet erased in the communication channel.

4. The method according to claim 3, further comprising a node expansion process of installing a new node so that a total number of edges of the sparse graph is not changed and a minimum loop is not shortened.

* * * * *